(12) United States Patent
Ushikubo et al.

(10) Patent No.: US 7,919,783 B2
(45) Date of Patent: Apr. 5, 2011

(54) LIGHT-EMITTING ELEMENT AND LIGHT-EMITTING DEVICE EMPLOYING THE SAME

(75) Inventors: Takahiro Ushikubo, Kanagawa (JP); Satoshi Seo, Kanagawa (JP); Nozomu Sugisawa, Kanagawa (JP); Tomoya Aoyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 581 days.

(21) Appl. No.: 11/986,753

(22) Filed: Nov. 26, 2007

(65) Prior Publication Data

US 2008/0130278 A1 Jun. 5, 2008

(30) Foreign Application Priority Data

Nov. 30, 2006 (JP) .................... 2006-324226

(51) Int. Cl.
*H01L 29/20* (2006.01)
*H01L 33/00* (2006.01)
(52) U.S. Cl. ....... 257/89; 257/40; 257/79; 257/E51.001; 257/E51.022
(58) Field of Classification Search .......... 257/40, 257/79, 89, E51.001, E51.022
See application file for complete search history.

(56) References Cited

U.S. PATENT DOCUMENTS

| 6,759,145 | B2 | 7/2004 | Lin et al. |
| 6,936,961 | B2 | 8/2005 | Liao et al. |
| 2003/0099860 | A1 | 5/2003 | Lin et al. |
| 2003/0127967 | A1 | 7/2003 | Tsutsui et al. |
| 2003/0189401 | A1 | 10/2003 | Kido et al. |
| 2004/0202893 | A1 | 10/2004 | Abe |
| 2004/0227460 | A1 | 11/2004 | Liao et al. |

(Continued)

FOREIGN PATENT DOCUMENTS

EP        1 318 553 A2    6/2003

(Continued)

OTHER PUBLICATIONS

Kajii et al, "Study of Transient Electroluminescence Process Using Organic Light-Emitting Diode with Partial Doping Layer," Japanese Journal of Applied Physics, vol. 45, No. 4B, 2006, pp. 3721-3724.*

(Continued)

*Primary Examiner* — Kenneth A Parker
*Assistant Examiner* — Anthony Ho
(74) *Attorney, Agent, or Firm* — Husch Blackwell LLP

(57) ABSTRACT

An object is to provide a white light-emitting element which emits broad white light which is close to natural light and covers a wide wavelength range; that is, a white light-emitting element which has a broad spectrum waveform. Further, there are various different kinds of white light; however, in particular, an object is to provide a white light-emitting element which emits white light which is close to the standard white color of the NTSC. Over a substrate 100, a second light-emitting element 110 and a first light-emitting element 120 are stacked in series. The first light-emitting element 120 exhibits a light emission spectrum having two peaks (two peaks in the blue to green wavelength range) and is disposed close to a film of light-reflecting material. The second light-emitting element 110 exhibits a light emission spectrum having a peak in the orange to red wavelength range, and is disposed in a position which is not close to the film of light-reflecting material.

20 Claims, 8 Drawing Sheets

U.S. PATENT DOCUMENTS

| | | | |
|---|---|---|---|
| 2004/0263066 A1 | 12/2004 | Abe et al. | |
| 2005/0134174 A1 | 6/2005 | Shiratori et al. | |
| 2005/0156197 A1 | 7/2005 | Tsutsui et al. | |
| 2006/0091797 A1 | 5/2006 | Tsutsui et al. | |
| 2006/0292394 A1* | 12/2006 | Iwaki et al. | 428/690 |

FOREIGN PATENT DOCUMENTS

| | | |
|---|---|---|
| EP | 1 351 558 A1 | 10/2003 |
| EP | 1 478 025 A2 | 11/2004 |
| JP | 6-207170 | 7/1994 |
| JP | 2002-260859 | 9/2002 |
| JP | 2003-45676 | 2/2003 |
| JP | 2003-187978 | 7/2003 |
| JP | 2003-264085 | 9/2003 |
| JP | 2003-272860 | 9/2003 |
| JP | 2004-6165 | 1/2004 |
| JP | 2004-327431 | 11/2004 |
| JP | 2004-327432 | 11/2004 |
| JP | 2004-342614 | 12/2004 |
| JP | 2005-183213 | 7/2005 |
| JP | 2006-12793 | 1/2006 |
| WO | WO 2005/115059 A1 | 12/2005 |

OTHER PUBLICATIONS

Zhang et al, "Blue/White Organic light Emitting Diodes and Passive Matrix Display," Proc. of SPIE, vol. 5632, 2005, pp. 45-52.*

Kishigami et al, "White Organic Electroluminescent Devices Having a Metal-Doped Electron Injection Layer," IPAP Conf. Series 6, pp. 104-107.*

Kido, J. et al, "Multilayer White Light-Emitting Organic Electroluminescent Device," Science, vol. 267, Mar. 3, 1995, pp. 1332-1334.

Kido, J. et al, "Single-Layer White Light-Emitting Organic Electroluminescent Devices Based on Dye-Dispersed Poly(N-vinylcarbazole)," Applied Physics Letters, vol. 67, No. 16, Oct. 16, 1995, pp. 2281-2283.

Hosokawa, C. et al, "31.3: Organic EL Materials Based on Styryl and Amine Derivatives," SID '01 Digest, Society for Information Display 2001 International Symposium Digest of Technical Papers, vol. XXXII, Jun. 5-7, 2001, pp. 522-525.

* cited by examiner

LIGHT-EMITTING ELEMENT AND LIGHT-EMITTING DEVICE EMPLOYING THE SAME

BACKGROUND OF THE INVENTION

1. Field of the Invention

The present invention relates to a light-emitting element which includes a light-emitting organic compound or inorganic compound and which emits light when a voltage is applied. In particular, the invention relates to a light-emitting element which exhibits white light emission and to a light-emitting device employing the light-emitting element which exhibits white light emission.

2. Description of the Related Art

In recent years, there has been extensive research and development of light-emitting elements which employ a light-emitting organic compound, which are a kind of light-emitting element. In a common structure of such a light-emitting element, a layer including a light-emitting organic compound or inorganic compound (hereinafter referred to as a light-emitting layer) is interposed between a pair of electrodes, and when a voltage is applied to the element, electrons and holes are each injected and transported from the pair of electrodes to the light-emitting layer. When those carriers (electrons and holes) recombine, an excited state of the light-emitting organic compound or inorganic compound is formed, and when the light-emitting organic compound or inorganic compound returns to a ground state, light is emitted.

Further, kinds of excited state that can be formed by an organic compound are a singlet excited state and a triplet excited state. Light emission in the case of a singlet excited state is referred to as fluorescence, and light emission in the case of a triplet excited state is referred to as phosphorescence.

Such a light-emitting element is usually formed of thin films which have an approximate thickness of submicrons to several microns. Therefore, they can be manufactured to be thin and light, which is a large advantage. Further, such light-emitting elements also have an advantage in that the period of time from when the carriers are injected until light is emitted is microseconds at the most, so they have a very high response speed. Moreover, because sufficient light-emission can be obtained with a direct current voltage of approximately several to several tens of volts, power consumption is also relatively low. Due to these advantages, the above-described light-emitting element is attracting attention as a next-generation flat-panel display element.

Further, because the pair of electrodes and the light-emitting layer are formed as films in such a light-emitting element, surface light emission can easily be obtained by forming a large-area element. Since this is a feature which is hard to obtain in light sources such as incandescent lamps and LEDs (point light sources) or in fluorescent lamps (line light sources), the above-described light-emitting element has a high utility value as a light source such as a lighting device.

Considering these fields of application, it can be said that the development of a light-emitting element such as that described above which is a white light-emitting element is an important subject. If a white light-emitting element with sufficient luminance, light-emitting efficiency, element life, and chromaticity can be obtained, by combining it with a color filter, a quality full color display can be manufactured, and further, application to white light sources such as backlights and lighting devices can be also considered.

Rather than being light-emitting elements which exhibit white light emission which has peaks in the wavelength ranges of red, green, and blue (the three primary colors of light), most white light-emitting elements are light-emitting elements which exhibit white light emission which is a combination of complementary colors; for example, blue light emission and golden yellow light emission (such light-emitting elements will hereinafter be referred to as 2-wavelength-type white light-emitting elements). For example, see Non-Patent Document 1.

[Non-Patent Document 1] Chishio Hosokawa (and 7 other authors), SID '01 Digest, 31.3 (pp. 522-525), 2001.

In Non-Patent Document 1, white light-emission is obtained by stacking two light-emitting layers which have a complementary color relationship, such that they are in contact with each other. Such a 2-wavelength white light-emitting element has high light-emitting efficiency, and can have a relatively long element life. In Non-Patent Document 1, values of an initial luminance of 400 cd/m$^2$ and a luminance half-life of 10,000 hours were obtained.

However, while a white color which is good from a CIE chromaticity coordinates point of view can be obtained with a 2-wavelength white light-emitting element, the light emission spectrum of the white color is not continuous, and only has two peaks, which have the complementary color relationship. Accordingly, it is difficult to obtain broad white light which is close to natural light. Further, if the spectrum of one of the complementary colors is dependent on current density or lighting time and varies, the chromaticity tends to deviate greatly from white. Further, if the spectrum of one of the complementary colors varies, in the case of a full color display in which the element is combined with a color filter, transmission spectrums of the color filters for red, green, and blue do not match the light emission spectrum of the element, so it is difficult to produce desired colors.

Meanwhile, research and development of white light-emitting elements which are not 2-wavelength white light-emitting elements such as those described above, but rather have a light emission spectrum with peaks in the wavelength ranges of red, green, and blue (hereinafter referred to as 3-wavelength-type white light-emitting elements) is also underway (e.g., see Non-Patent Document 2 and Non-Patent Document 3). Non-Patent Document 2 describes a structure in which three light-emitting layers, a red one, a green one, and a blue one, are layered. Non-Patent Document 3 describes a structure in which light-emitting materials which exhibit red, green, and blue light emission are included in the one light-emitting layer.

[Non-Patent Document 2] J. Kido (and 2 other authors), Science, vol. 267, pp. 1332-1334, 1995.

[Non-Patent Document 3] J. Kido (and 2 other authors), Applied Physics Letters, vol. 67 (16), pp. 2281-2283, 1995.

However, these 3-wavelength white light-emitting elements are inferior to 2-wavelength white light-emitting elements in the areas of light-emitting efficiency and element life, and greater improvements of them are necessary. Further, it is known that in many cases, the spectrum of elements such as the one described in Non-Patent Document 2 is dependent on flowing current density and varies, so stable white light cannot be obtained.

Further, attempts to develop a white light-emitting element which approach the task from a different angle to that of Non-Patent Documents 1, 2, and 3 have also been carried out (e.g., see Patent Document 1 and Patent Document 2). Patent Document 1 and Patent Document 2 describe attempts to obtain a high current efficiency (the luminance which can be obtained with respect to a given current density) by stacking a plurality of light-emitting elements in series and combining the light emission from each of the light-emitting elements. Further, it is disclosed that by stacking light-emitting elements with different light-emission colors in series, a white light-emitting element can be obtained.

[Patent Document 1] Japanese Patent Laid-Open No. 2003-264085
[Patent Document 2] Japanese Patent Laid-Open No. 2003-272860

However, in the methods disclosed in Patent Documents 1 and 2, in order to obtain a 3-wavelength white light-emitting element, for example, it is necessary to layer three elements in series. That is, in order to manufacture a white light-emitting element having a spectrum which covers a broad wavelength range (a white light-emitting element in which a plurality of different light emission colors are mixed), the number of light-emitting elements which are stacked in series greatly increases accordingly, and the driving voltage multiplies. Further, because many light-emitting elements are stacked in series, the total stacked film thickness increases, so light emission tends to be affected by optical interference. Therefore, it is difficult to adjust the light emission spectrum.

As mentioned above, while conventional 2-wavelength white light-emitting elements have high light-emitting efficiency and a long element life, they have a problem in that their spectrum does not cover some parts of a broad wavelength range. Further, accompanying this problem, the chromaticity of their white color tends to change over time. Moreover, in addition to the fact that conventional 3-wavelength white light-emitting elements have low light-emitting efficiency and a short element life, they have a problem in that the shape of their spectrum tends to be dependent on current density. Further, it is not practical to try to obtain a white light-emitting element having a spectrum which covers a broad wavelength range using the methods disclosed in Patent Documents 1 and 2, because when these methods are used, the number of light-emitting elements which are stacked in series greatly increases and driving voltage greatly increases.

Further, the present applicant has disclosed a 4-wavelength-type white light-emitting element in Patent Document 3.

[Patent Document 3] Japanese Patent Laid-Open No. 2006-12793

SUMMARY OF THE INVENTION

In conventional 3-wavelength white light-emitting elements, light emissions of narrow width from each of the R, G, and B wavelength ranges are combined. Therefore, in the spectrum of the white light obtained, three very sharp protruding peaks are produced, and there is a gap between natural light having a continuous spectrum and the white light obtained from the conventional element which is hard to fill in terms of color rendering properties and the like.

Therefore, an object of the present invention is to provide a white light-emitting element having broad white light with a broad wavelength range which is close to natural light; that is, white light which has a broad spectrum waveform.

Further, an object of the invention is to provide a white light-emitting element which has superior color rendering properties, which is an important factor for light sources such as lighting devices and the like.

Furthermore, there are different kinds of white light; however, in particular, an object of the invention is to provide a white light-emitting element whose emission color is close to the standard white color of the NTSC (National Television System Committee).

Moreover, an object of the invention is to provide a white light-emitting element having a light emission spectrum whose shape does not readily depend on current density.

As a result of much diligent investigation, the present inventors have achieved at least one of the above-mentioned objects by layering a first light-emitting element which exhibits a first light emission spectrum having a peak in a red wavelength range and a second light-emitting element which exhibits a second light emission spectrum having peaks in both a blue wavelength range and a green wavelength range, to obtain a white color having both the spectrums.

A structure of the invention disclosed in this specification is a light-emitting element which exhibits white light emission and includes a first light-emitting element and a second light-emitting element which are stacked in series over a substrate with a light-transmitting property. The first light-emitting element includes a first light-emitting layer including a light-emitting organic compound, which is interposed between a first anode and a first cathode. The second light-emitting element includes a second light-emitting layer and a third light-emitting layer which each include a light-emitting organic compound, which are interposed between a second anode and a second cathode. The first light-emitting element exhibits a first light emission spectrum having a peak in a red wavelength range (600 to 680 nm), and the second light-emitting element exhibits a second light emission spectrum having peaks in both a blue wavelength range (430 to 480 nm) and a green wavelength range (500 to 540 nm).

Further, in the above structure, as a guest material of the first light-emitting layer, a 4H-pryan derivative such as 4-(dicyanomethylene)-2,6-bis[p-(dimethylamino)styryl]-4H-pyran (abbr.: BisDCM), 4-(dicyanomethylene)-2,6-bis[2-(jou-lolidin-9-yl)ethenyl]-4H-pyran (abbr.: BisDCJ), 4-(dicyanomethylene)-2-methyl-6-(9-julolidyl)ethynyl-4H-pyran (abbr.: DCM2), {2-isopropyl-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbr.: DCJTI), or {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbr.: BisDCJTM) is highly efficient and preferable. In particular, DCJTI and BisDCJTM are preferable, as they have a light emission peak at around 620 nm. Further, as a host material of the first light-emitting layer, it is preferable to use a host material which includes a mixture of a metal complex such as $Alq_3$ and a tetracene derivative such as rubrene.

Further, in the above structure, an anthracene derivative is preferably used as a guest material of the second light-emitting layer, because highly efficient light emission can be obtained when an anthracene derivative is used. For example, an anthracene derivative in which an amino group is substituted into the 2 position is preferable because highly efficient green light emission can be obtained with such an anthracene derivative. N-(9,10-diphenyl-2-anthryl)-N,9-diphenyl-9H-carbazol-3-amine (abbr.: 2PCAPA) has a long life and is particularly suitable. Further, an anthracene derivative is preferably used as a host material of the second light-emitting layer. 9,10-bis(2-naphthyl)-2-t-butylanthracene (abbr.: t-BuDNA) and 9-[4-(10-phenyl-9-anthryl)phenyl]-9H-carbazole (abbr.: CzPA) are preferable because they are electrochemically stable.

Further, in the above structure, as a guest material of the third light-emitting layer, a styrylamine derivative is preferable. For example, N,N'-bis[4-(9H-carbazol-9-yl)phenyl]-N,N-diphenylstilbene-4,4'-diamine (abbr.: YGA2S), N,N'-diphenyl-N,N'-bis(9-phenyl-9H-carbazol-3-yl)stilbene-4,4'-diamine (PCA2S), or the like may be used. In particular, YGA2S is preferable because it has a peak at around 450 nm. Further, as a host material of the third light-emitting layer, an anthracene derivative is preferable; 9,10-bis(2-naphthyl)-2-t-butylanthracene (abbr.: t-BuDNA) and the aforementioned CzPA are suitable. In particular, CzPA is preferable because it is electrochemically stable.

Further, in the above structure, in a case where the second cathode is a reflective metal material, or in a case where the second cathode has a light-transmitting property and a reflective material is stacked over the second cathode, considering interference of light, it is preferable to dispose the red light-emitting first light-emitting layer in a position which is not close to the second cathode. That is, when a first light-emitting layer with a light emission spectrum having a peak in the blue wavelength range, a second light-emitting layer with a light emission spectrum having a peak in the green wavelength range, and a third light-emitting layer with a light emission spectrum having a peak in the red wavelength range are disposed in that order from the second cathode, interference of light can be suppressed. Further, in a case where the first light-emitting layer and the second light-emitting layer are adjacent to each other and there is hardly any difference in their respective distances from the second cathode, and therefore interference of light is small and can be ignored, they may be stacked in reverse order.

By employing the above-described structure, a simpler structure can be formed than the conventional structure in which three elements are stacked in series. Further, when the above structure is employed, the number of elements that are stacked can be decreased, compared with a structure in which light-emitting elements each having only one peak are stacked in series. Accordingly, increase in driving voltage can be suppressed, which is useful. Further, by employing the above-described structure, a white light-emitting element which emits white light which is close to the standard white color of the NTSC (chromaticity coordinates: x=0.31, y=0.33) can be provided.

Further, as a result of much diligent investigation, the present inventors have achieved at least one of the above-mentioned objects, by obtaining white light having a spectrum with a trapezoidal shape which covers a wide wavelength range; it covers at least the visible light range.

Another structure of the invention disclosed in this specification is a light-emitting element which includes a first light-emitting element and a second light-emitting element which are stacked in series. The first light-emitting element includes a first light-emitting layer and a second light-emitting layer which each include a light-emitting organic compound, which are interposed between a first anode and a first cathode. The second light-emitting element includes a third light-emitting layer and a fourth light-emitting layer which each include a light-emitting organic compound, which are interposed between a second anode and a second cathode. The first light-emitting element exhibits a first white light emission spectrum and the second light-emitting element exhibits a second white light emission. These different light emission spectrums are synthesized and the light-emitting element exhibits white light emission.

Further, in the above structure, the first light-emitting layer includes a 4H-pyran derivative as a guest material and an aromatic amine compound as a host material. Specifically, {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile is the guest material and 4,4'-bis[N-(1-naphthyl)-N-phenylamino]biphenyl is the host material.

Further, in the above structure, the second light-emitting layer includes an anthracene derivative as a guest material, and another anthracene derivative, which differs to the anthracene derivative of the guest material, as a host material. Specifically, 9,10-bis{4-[N-(4-diphenylamino)phenyl-N-phenyl]aminophenyl}-2-tert-butylanthracene is the guest material and 9-[4-(10-phenyl-9-anthryl)phenyl]-9H-carbazole is the host material.

Further, in the above structure, the third light-emitting layer includes a tetracene derivative as a guest material and an aromatic amine compound as a host material. Specifically, rubrene is the guest material and 4,4'-bis[N-(1-naphthyl)-N-phenylamino]biphenyl is the host material.

Further, in the above structure, the fourth light-emitting layer includes a styrylamine derivative as a guest material and an anthracene derivative as a host material. Specifically, N,N'-bis[4-(9H-carbazol-9-yl)phenyl]-N,N'-diphenylstilbene-4,4'-diamine is the guest material and 9-[4-(10-phenyl-9-anthryl)phenyl]-9H-carbazole is the host material.

By employing the above-described structures, white light emission that has a spectrum shape which has few wavelength range omissions across a wide wavelength range and is smooth, that is, broad white light emission which is close to natural light, can be obtained. In the conventional 3-wavelength white light-emitting element, light emissions of narrow width from each of the R, G, and B wavelength ranges are combined. Therefore, three sharp protruding peaks are produced in the spectrum of the obtained white light. However, the spectrum of white light obtained by employing the above-described structures has four peaks, and each peak-to-peak interval, that is, each valley of the spectrum waveform, is shallow, so the spectrum can be regarded as having a trapezoidal shape. Further, by employing the above-described structures, a white light-emitting element which has white light which is close to the standard white color of the NTSC (chromaticity coordinates: x=0.31, y=0.33) can be provided.

Further, a light-emitting device whose chromaticity does not easily change over time or a light-emitting device with a light emission spectrum whose shape does not readily depend on current density can be provided. Further, even if any one of the four light-emitting layers deteriorates over time or luminance of any one of the four light-emitting layers changes due to current density, because of the effect of the spectrum being broad, deviation of the chromaticity is relatively small.

The above-described structures are not merely items of design, but rather structures that were invented after careful investigation by the inventors which involved forming various light-emitting elements, manufacturing light-emitting devices which employed those light-emitting elements, and displaying images using the devices.

Further, by manufacturing a light-emitting device which employs a light-emitting element of the invention such as those described above, a highly efficient light-emitting device having a spectrum which covers a broad wavelength range, a light-emitting device whose chromaticity does not easily change over time, or a light-emitting device having a light emission spectrum whose shape does not readily depend on current density can be provided. Accordingly, the invention encompasses light-emitting devices which employ a light-emitting element of the invention. In particular, light-emitting devices or light fittings which further include a color filter are preferable as light-emitting devices which employ a light-emitting element of the invention, because a light-emitting element of the invention has a spectrum which covers a broad wavelength range.

Note that the term 'light-emitting device' in this specification refers to a light emitter or an image display device which employs a light-emitting element, or the like. Further, modules in which a connector, for example a flexible printed circuit board (FPC), TAB (tape automated bonding) tape, or a TCP (tape carrier package), is attached to a light-emitting element; modules in which a printed wiring board is provided at the end of TAB tape or a TCP; and modules in which an IC (integrated circuit) is directly mounted onto a light-emitting element by a COG (chip on glass) method, are also encompassed by the term 'light-emitting device'.

By implementing the invention, a highly efficient white light-emitting element having a spectrum which covers a broad wavelength range can be provided. Further, a white light-emitting element whose light is close to that of the standard white color of the NTSC can be provided.

Further, a white light-emitting element which has superior color rendering properties, which is an important factor for light sources such as lighting devices and the like, can be provided.

Further, a white light-emitting element having a white color whose chromaticity does not easily change over time can be provided. Further, a white light-emitting element having a light emission spectrum whose shape does not readily depend on current density can be provided.

DETAILED DESCRIPTION OF THE INVENTION

Figure 1A:
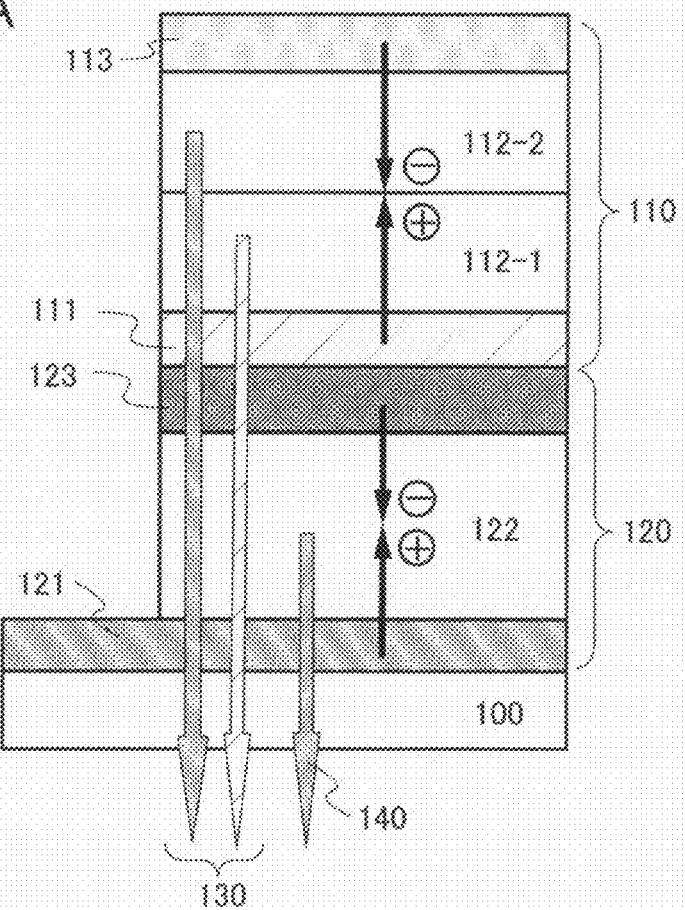
FIGS. 1A and 1B show a structural example and a light emission spectrum of a light-emitting element of the invention.

Below, embodiment modes of the invention will be described in detail, with reference to basic structures, principles of operation, and specific structural examples. Note that at least one of electrodes of a light-emitting element has a light-transmitting property, so that light which is emitted can be extracted out. Accordingly, not only a conventional element structure in which an electrode having a light-transmitting property is formed over a substrate and light is extracted out through the side which the substrate is on, but also a structure in which light is extracted out through the side opposite to that which the substrate is on, can be applied.

Embodiment Mode 1

First, an example of a structure of stacked light-emitting elements will be described, with reference to FIG. 1A. A second light-emitting element 110 and a first light-emitting element 120 are stacked in series over a substrate 100. The first light-emitting element 120 has a structure which includes a first light-emitting layer 122 which is interposed between a first anode 121 and a first cathode 123.

Further, the second light-emitting element 110 has a structure which includes a second light-emitting layer 112-1 and a third light-emitting layer 112-2 which are interposed between a second anode 111 and a second cathode 113. The second light-emitting layer 112-1, the third light-emitting layer 112-2, and the first light-emitting layer 122 each include a light-emitting organic compound.

A light-emitting layer formed from a stack which includes the second light-emitting layer 112-1 and the third light-emitting layer 112-2 exhibits a light emission spectrum having two peaks in the blue to green wavelength range. The light emission spectrum obtained when the light-emitting layer formed from this stack is interposed between a pair of electrodes (note that at least one of the electrodes has a light-transmitting property) is shown by the solid line in FIG. 1B.

Further, the first light-emitting layer 122 exhibits a light emission spectrum having a peak in the orange to red wavelength range. The light emission spectrum obtained when the first light-emitting layer 122 is interposed between a pair of electrodes (note that at least one of the electrodes has a light-transmitting property) is shown by the dotted line in FIG. 1B.

When the side which the first anode is on is positive-biased and the side which the second cathode is on is negative-biased with respect to light-emitting elements layered in this way, a current with a given current density J flows through the elements. At this time, holes are injected from the first anode 121 to the first light-emitting layer 122, and electrons are injected from the first cathode 123 to the first light-emitting layer 122, and when they recombine, a first light emission is obtained from the first light-emitting element 120. Note that this first light emission has a light emission spectrum 140 shown in FIG. 1B. Further, holes are injected from the second anode 111 to the second light-emitting layer 112-1 and the third light-emitting layer 112-2, and electrons are injected from the second cathode 113 to the second light-emitting layer 112-1 and the third light-emitting layer 112-2, and when they recombine, a second light emission is obtained from the second light-emitting element 110. Note that this second light emission has a light emission spectrum 130 shown in FIG. 1B. That is, light emission is obtained from both the first light-emitting element 120 and the second light-emitting element 110.

Further, when considered as an equivalent circuit, the common current with the current density J flows through the first light-emitting element and the second light-emitting element, and each of the elements emits light with a luminance which corresponds to the current density J. By forming the first anode and the second anode using a light-transmitting material, both the first light emission and the second light emission can be extracted out. Further, by forming the second cathode 113 using a light reflecting material, light emitted can be reflected, and light emission can be obtained efficiently on the side through which light is extracted.

Here, in the invention, one of the first light emission and the second light emission exhibits a first light emission spectrum having at least two peaks, and the other one of the first light emission and the second light emission exhibits a second light emission spectrum having a peak in a position which differs to those of the peaks of the first light emission spectrum. For example, the invention has a structure in which the first light emission exhibits a first light emission spectrum having a peak in the orange to red wavelength range, and the second light emission exhibits a second light emission spectrum having two peaks in the blue to green wavelength range. Note that neither the first light emission or the second light emission is white light; however, since they are complementary colors, when they are both extracted out, they are combined and form white light. Further, since the second cathode 113 is a light-reflecting material, preferably the film thicknesses of the second light-emitting layer 112-1, the third light-emitting layer 112-2, the first anode 121, and the first cathode 123 are adjusted taking the interference of light into consideration.

In a light-emitting element in which light is emitted when a light-emitting organic compound is excited by current, it is relatively easy to obtain light emission which exhibits a light emission spectrum having two peaks (the second light emission spectrum in the example given above), as typified by the 2-wavelength white light-emitting elements of conventional technology. However, it is very difficult to obtain a light emission spectrum having three or more peaks, or to obtain a broad light emission spectrum. A structure of the invention provides a method of overcoming this technical problem. That is, the invention is a structure in which a light-emitting element which exhibits a light emission spectrum having two peaks (two peaks in the blue to green wavelength range), such as a 2-wavelength light-emitting element, serves as a base (the second light-emitting element in the example above), and is stacked in series with a light-emitting element having a light emission spectrum in a region which cannot be covered by the light emission spectrum with two peaks; and the light emissions are combined to obtain white light emission. Employing this structure is useful because the number of elements that is stacked can be reduced, compared to simply stacking in series light-emitting elements which each have only one peak; and the increase in driving voltage which accompanies an increase in the number of elements stacked can be suppressed. Further, in the light-emitting element of the invention, since a luminance obtained is the sum of both the luminance of the first light-emitting element and the luminance of the second light-emitting element, which are obtained with respect to a given current density J, a high luminance with respect to current (namely, current efficiency) is also obtained.

Figure 1B:
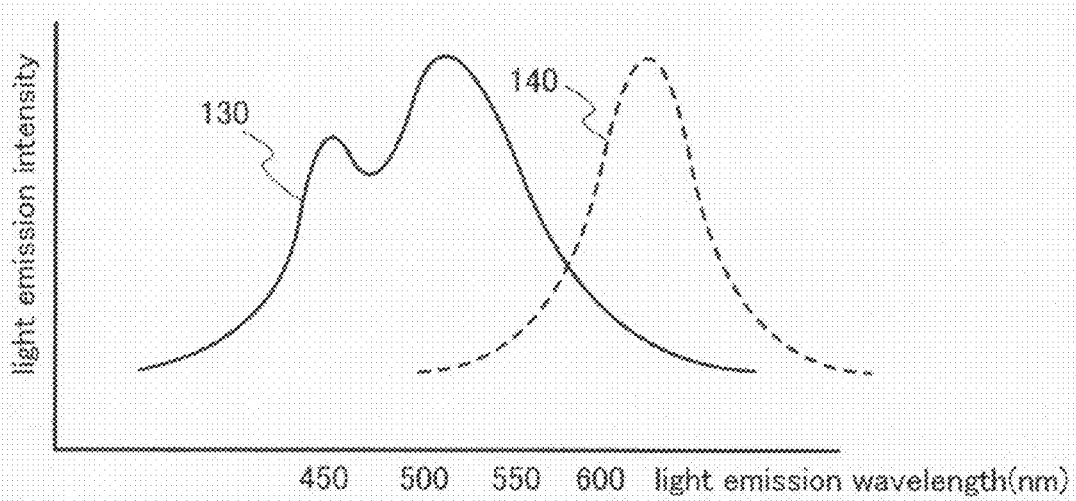

Further, in the description of FIG. 1A, an example in which the second cathode 113 is formed of a light-reflecting material is described; however, a structure in which the second cathode 113 is a light-transmitting material and a film of reflective material is formed over the second cathode may also be employed. In that case, preferably the film thicknesses of the second cathode 113, the second light-emitting layer 112-1, the third light-emitting layer 112-2, the first anode 121, and the first cathode 123 are adjusted taking the interference of light into consideration. Preferably a material with low electrical resistance, for example, a conductive material including Al, Ag, or the like, is used for the film of reflective material, so that the power consumption of the light-emitting element can be reduced.

Further, in the above description, a structure in which the second cathode 113 is formed of a light-reflecting material and light emitted is extracted out through the first anode and the substrate 100 is described; however, the invention is not limited to this structure. For example, a structure may be employed in which the second light-emitting element 110 is formed over a substrate; over that, the first light-emitting element 120 is formed; the second anode 111 is formed of a light-reflecting material; the second cathode 113, the first anode 121, and the first cathode 123 are light-transmitting materials; and light emitted is extracted out through the direction opposite to that shown in FIG. 1A. Further, a structure in which the second anode 111 is a light-transmitting material rather than a light-reflecting material, and a film of reflective material is provided below the second anode 111, may be employed.

In the above structures, a structure in which interference of light is prevented is formed by disposing a second light-emitting element which exhibits a light emission spectrum having two peaks (two peaks in the blue to green wavelength range) in a position close to the film of light-reflecting material, and disposing a first light-emitting element which exhibits a light emission spectrum having a peak in the orange to red wavelength range in a position not close to the film of light-reflecting material.

Further, the film thickness of each stacked layer may be adjusted to deliberately create slight interference of light so that the production of a sharp peak which juts out is suppressed and light emitted is closer to natural light having a continuous spectrum. Furthermore, by adjusting the film thickness of each stacked layer and deliberately creating a small amount of interference of light, the position of a peak of a spectrum can be changed.

Regarding the light-emitting element of the invention, the aim is not to obtain light emission having a spectrum in which both the light emission spectrum 130 of the second light-emitting element and the light emission spectrum 140 of the first light-emitting element simply overlap; rather, the aim is to obtain a white color which is close to natural light having a continuous spectrum by adjusting the way light-emitting elements are stacked, the film thickness of each stacked layer, and the material of each stacked layer, and through utilizing interference of light, and the like.

A case where the first light-emitting layer, the second light-emitting layer, and the third light-emitting layer each include a light-emitting organic compound was described above; however, the light-emitting layers may include a light-emitting inorganic compound. That is, the first light-emitting element and the second light-emitting element may be inorganic LEDs. Further, one of the first light emission and the second light emission exhibits a first light emission spectrum having at least two peaks (two peaks in the blue to green wavelength range), and the other one of the first light emission and the second light emission exhibits a second light emission spectrum having a peak in a position which differs to those of the peaks of the first light emission spectrum.

Further, the concept of the invention can be applied not just to a light-emitting element in which light emission is caused by current, but also to a collision excitation-type light-emitting element, such as an inorganic EL element.

That is, two collision excitation-type light-emitting elements are connected in series. Further, one of the two collision excitation-type light-emitting elements exhibits a first light emission spectrum having at least two peaks (two peaks in the blue to green wavelength range), and the other one of the two collision excitation-type light-emitting elements exhibits a second light emission spectrum having a peak in a position which differs to those of the peaks of the first light emission spectrum.

By employing a structure such as those described above, much of the visible light range can be covered, and highly efficient white light can easily be obtained.

Embodiment Mode 2

Figure 2A:
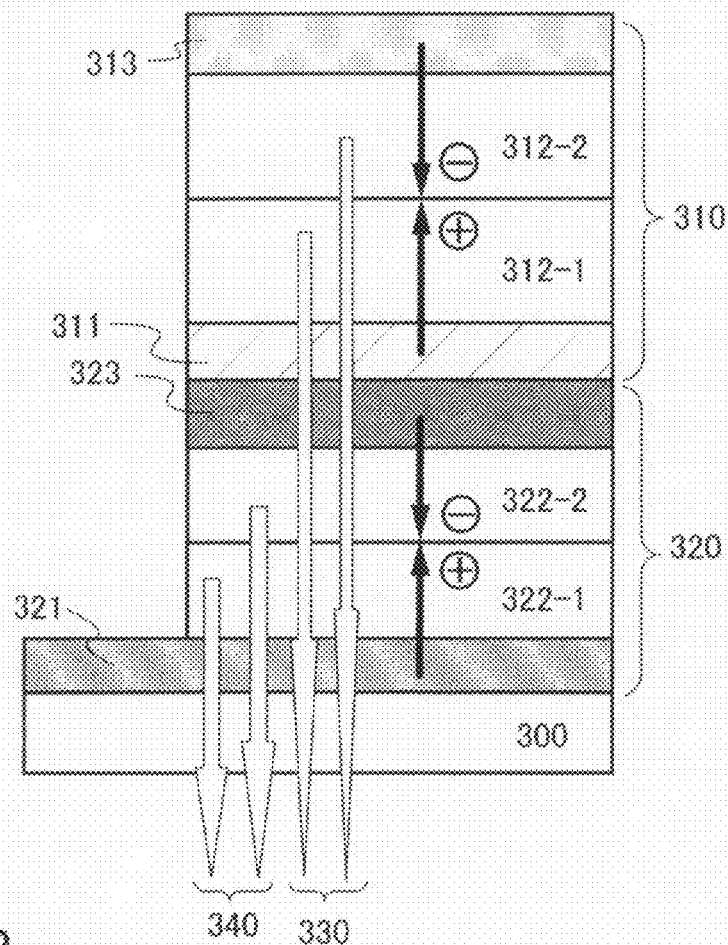
FIGS. 2A and 2B show a structural example and a light emission spectrum of a light-emitting element of the invention.

An element structure is shown in FIG. 2A. FIG. 2A is a structural example of a light-emitting element of the invention, in which a first light-emitting element 320 and a second light-emitting element 310 are stacked in series over a substrate 300. The first light-emitting element 320 has a structure which includes a first light-emitting layer 322-1 and a second light-emitting layer 322-2 which are interposed between a first anode 321 and a first cathode 323. Further, the second light-emitting element 310 has a structure which includes a third light-emitting layer 312-1 and a fourth light-emitting layer 312-2 which are interposed between a second anode 311 and a second cathode 313.

Here, a light-emitting layer of the first light-emitting element includes the first light-emitting layer 322-1 which exhibits a light emission spectrum having a peak in the orange to red wavelength range, and the second light-emitting layer 322-2 which exhibits a light emission spectrum having a peak in the blue-green to green wavelength range. Note that the first light-emitting layer 322-1 and the second light-emitting layer 322-2 may be stacked in reverse order.

Further, a light-emitting layer of the second light-emitting element includes the third light-emitting layer 312-1 which exhibits a light emission spectrum having a peak in the yellow to orange wavelength range, and the fourth light-emitting layer 312-2 which exhibits a light emission spectrum having a peak in the blue to blue-green wavelength range. Note that the third light-emitting layer 312-1 and the fourth light-emitting layer 312-2 may be stacked in reverse order.

When the side which the first anode 321 is on is positively biased and the side which the second cathode 313 is on is negatively biased in such a light-emitting element, light emission in which a first light emission and a second light emission are synthesized is obtained. Because the first light emission is a combination of light emission from both the first light-emitting layer 322-1 and the second light-emitting layer 322-2, it exhibits a light emission spectrum 330 having peaks in both the blue-green to green wavelength range and the orange to red wavelength range, as shown by the solid line in FIG. 2B. That is, the first light-emitting element exhibits light emission which is a 2-wavelength-type white color or a color that is close to white.

Figure 2B:
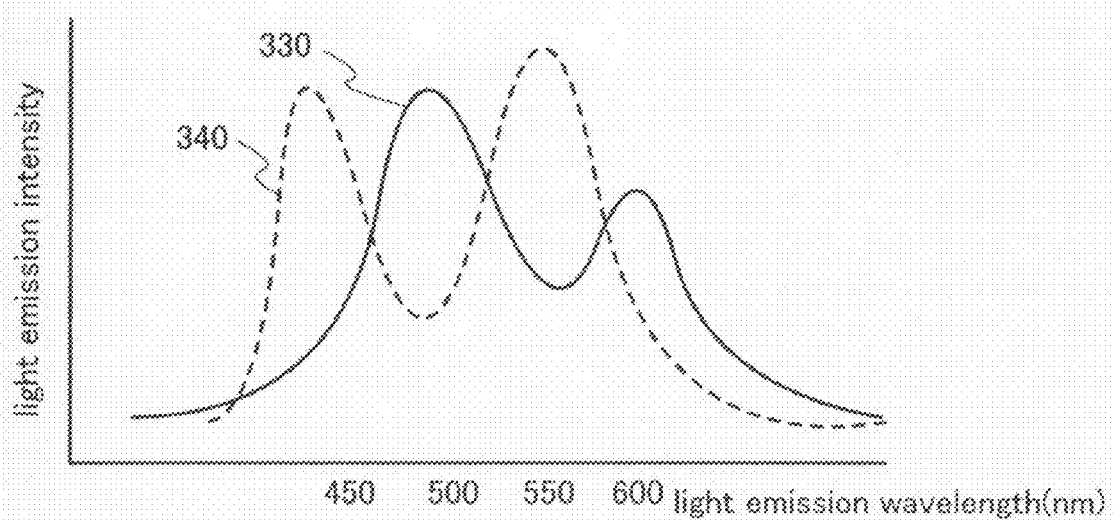

Further, since the second light emission is a combination of light emission from both the third light-emitting layer 312-1 and the fourth light-emitting layer 312-2, it exhibits a light emission spectrum 340 having peaks in both the blue to blue-green wavelength range and the yellow to orange wavelength range, as shown by the dotted line in FIG. 2B. That is, the second light-emitting element exhibits light emission which is a 2-wavelength-type white color or a color that is close to white, which is different to the color of the first light emission of the first light-emitting element.

Accordingly, white light emission which broadly covers the blue to blue-green wavelength range, the blue-green to green wavelength range, the yellow to orange wavelength range, and the orange to red wavelength range is obtained by the light-emitting element of the invention in Embodiment Mode 2 as a result of combining the light-emitting spectrum 330 of the first light-emitting element and the light emission spectrum 340 of the second light-emitting element.

Further, a structure in which the second cathode 313 is formed of a light reflecting material and light emitted is extracted out through the first anode 321 and the substrate 300 may be employed. In that case, a structure in which interference of light is prevented is formed by disposing the first light-emitting element, which exhibits a light emission spectrum having a peak in the orange to red wavelength range, in a position not close to the film of light-reflecting material. Further, a structure in which the second cathode 313 is a light-transmitting material rather than a light-reflecting material and in which a film of reflective material is provided over the second cathode 313 may be employed.

In addition, light may be made more like natural light having a continuous spectrum by adjusting the film thickness of each stacked layer to deliberately create slight interference of light so that the production of a sharp peak which juts out is suppressed and a trapezoidal light emission spectrum is obtained. Furthermore, by adjusting the film thickness of each stacked layer to deliberately create slight interference of light, the position of a peak of a light emission spectrum can be changed. By adjusting the film thickness of each stacked layer so that a plurality of peak intensities which appear in a light emission spectrum are made roughly the same, and by decreasing the intervals between peaks, white light emission having a light emission spectrum which is closer to a trapezoidal shape can be obtained.

Further, this structure has an advantage in that even if, for example, the light emission luminance of the fourth light-emitting layer 312-2 (which exhibits a light emission spectrum having a peak in the blue to blue-green wavelength range) deteriorates over time or changes due to current density, because the contribution of the fourth light-emitting layer 312-2 with respect to the entire spectrum is approximately one quarter, deviation of chromaticity will be relatively small. In the case of a conventional 2-wavelength white light-emitting element, a change in the luminance of a light-emitting layer would greatly affect chromaticity.

Further, a structure may be employed in which the second light-emitting element 310 is formed over a substrate; the first light-emitting element 320 is formed over that; the second anode 311 is a light-reflecting material; the second cathode 313, the first anode 321, and the first cathode 323 are light-transmitting materials; and light emitted is extracted out through the direction opposite to that shown in FIG. 2A. Further, a structure in which the second anode 311 is a light-transmitting material rather than a light-reflecting material and in which a film of reflective material is provided below the second anode 311 may be employed.

Embodiment Mode 3

Below, materials and element structures which can be used for structures of light-emitting elements of the invention; that is, the first light-emitting element 120 and the second light-emitting element 110 in FIG. 1A, and the first light-emitting element 320 and the second light-emitting element 310 in FIG. 2A; will be described. In the structure in FIG. 1A, a hole injecting layer and/or a hole transporting layer may be provided between the second anode 111 and the second light-emitting layer 112-1 and between the first anode 121 and the first light-emitting layer 122. Further, in the structure in FIG. 1A, an electron injecting layer and/or an electron transporting layer may be provided between the second cathode 113 and the third light-emitting layer 112-2 and between the first cathode 123 and the first light-emitting layer 122. In the structure in FIG. 2A, a hole injecting layer and/or a hole transporting layer may be provided between the second anode 311 and the third light-emitting layer 312-1 and between the first anode 321 and the first light-emitting layer 322-1. Further, in the structure in FIG. 2A, an electron injecting layer and/or an electron transporting layer may be provided between the second cathode 313 and the fourth light-emitting layer 312-2 and between the first cathode 323 and the second light-emitting layer 322-2.

Note that a hole injecting layer is a layer which exhibits a function of accepting holes from an anode, and a hole transporting layer is a layer which exhibits a function of transferring holes to a light-emitting layer. Further, an electron injecting layer is a layer which exhibits a function of accepting electrons from a cathode, and an electron transporting layer is a layer which exhibits a function of transferring electrons to a light-emitting layer.

First, specific examples of materials which can be used for each of these layers will be given. Note that materials which can be applied to the invention are not limited to the following examples.

As a hole injecting material that can be used for the hole injecting layer, a phthalocyanine-based compound is effective; phthalocyanine (abbr.: $H_2Pc$), copper phthalocyanine (abbr.: CuPc), vanadyl phthalocyanine (abbr.: VOPc), and the like can be used. Further, a material that is a conductive macromolecular compound which has been chemically doped can be used; polyethylenedioxythiophene (abbr.: PEDOT) which has been doped with polystyrene sulfonate (abbr.: PSS); polyaniline (abbr.: PAni); or the like can be used. Further, a thin film of an inorganic semiconductor such as molybdenum oxide, vanadium oxide, nickel oxide, or the like, or an ultra-thin film of an inorganic insulator, such as aluminum oxide or the like, are also effective. Further, aromatic amine compounds such as 4,4',4"-tris(N,N-diphenyl-amino)-triphenylamine (abbr.: TDATA), 4,4',4"-tris[N-(3-methylphenyl)-N-phenyl-amino]-triphenylamine (abbr.: MTDATA), N,N'-bis(3-methylphenyl)-N,N'-diphenyl-1,1'-biphenyl-4,4'-diamine (abbr.: TPD), 4,4'-bis[N-(1-naphthyl)-N-phenylamino]biphenyl (abbr.: NPB), and N,N'-bis[4-[bis (3-methylphenyl)amino]phenyl]-N,N'-diphenyl-[1,1'-biphenyl]-4,4'-diamine (abbr.: DNTPD) or the like can also be used. Further, a material which exhibits an acceptor property with respect to any of these aromatic amine compounds may be added to one of the aromatic amine compounds. As specific examples, a material in which 7,7,8,8-tetracyano-2, 3,5,6-tetrafluoroquinodimethane (abbr.: $F_4$-TCNQ), which is an acceptor, has been added to VOPc, or a material in which molybdenum oxide, which is an acceptor, has been added to NPB, may be used.

As a hole transporting material that can be used for the hole transporting layer, an aromatic amine compound is suitable; TDATA, MTDATA, TPD, NPB, DNTPD, and the like, which are mentioned above, can be used.

Examples of electron transporting materials that can be used for the electron transporting layer are metal complexes such as tris(8-quinolinolato)aluminum (abbr.: $Alq_3$), tris(4-methyl-8-quinolinolato)aluminum (abbr.: $Almq_3$), bis(10-hydroxybenzo[h]-quinolinato)beryllium (abbr.: $BeBq_2$), bis (2-methyl-8-quinolinolato)(4-phenylphenolato)aluminum (abbr.: BAlq), bis[2-(2-hydroxyphenyl)benzoxazolato]zinc (abbr.: $Zn(BOX)_2$), bis[2-(2-hydroxyphenyl)benzothiazolato]zinc (abbr.: $Zn(BTZ)_2$), or the like. Further, as an alternative to a metal complex, an oxadiazole derivative, such as 2-(4-biphenylyl)-5-(4-tert-butylphenyl)-1,3,4-oxadiazole (abbr.: PBD) or 1,3-bis[5-(p-tert-butylphenyl)-1,3,4-oxadiazol-2-yl]benzene (abbr.: OXD-7); a triazole derivative, such as 3-(4'-tert-butylphenyl)-4-phenyl-5-(4"-biphenyl)-1,2,4-triazole (abbr.: TAZ) or 3-(4-tert-butylphenyl)-4-(4-ethylphenyl)-5-(4-biphenylyl)-1,2,4-triazole (abbr.: p-EtTAZ); an imidazole derivative, such as 2,2',2"-(1,3,5-benzenetriyl) tris[1-phenyl-1H-benzimidazole] (abbr.: TPBI); or a phenanthroline derivative, such as bathophenanthroline (abbr.: BPhen) or bathocuproine (abbr.: BCP), can be used.

As an electron injecting material for the electron injecting layer, an electron transporting material such as $Alq_3$, $Almq_3$, $BeBq_2$, BAlq, $Zn(BOX)_2$, $Zn(BTZ)_2$, PBD, OXD-7, TAZ, p-EtTAZ, TPBI, BPhen, or BCP, which were mentioned above, or the like can be used. Alternatively, an ultra-thin film of an insulator such as the following is often used: an alkali metal halide, such as LiF or CsF; an alkaline earth halide, such as $CaF_2$; or an alkali metal oxide, such as $Li_2O$. Further, an alkali metal complex such as lithium acetylacetonate (abbr.: Li(acac)) or 8-quinolinolatolithium (abbr.: Liq) is also effective. Furthermore, a material which exhibits a donator property with respect to the electron injecting material may be added to the electron injecting material. As a donor, an alkali metal, an alkali earth metal, a rare earth metal, or the like can be used. As specific examples, a material in which lithium, which is a donor, has been added to BCP, or a material in which lithium, which is a donor, has been added to $Alq_3$ can be used.

Next, structures of the light-emitting layers in the first light-emitting element 120 and the second light-emitting element 110 (122, 112-1, and 112-2) in FIG. 1A, and structures of the light-emitting layers in the first light-emitting element 320 and the second light-emitting element 310 (322-1, 322-2, 312-1, and 312-2) in FIG. 2A will be described. First, materials which can be used as a light-emitting organic compound will be mentioned; however, the invention is not limited to these materials, and any light-emitting organic compound may be used.

For example, blue to blue-green light emission can be obtained by using perylene, 2,5,8,11-tetra-t-butylperylene (abbr.: TBP), 9,10-diphenylanthracene, or the like as a guest material, and dispersing the guest material in a suitable host material. Alternatively, blue to blue-green light emission can be obtained from a styrylarylene derivative such as 4,4'-bis (2,2-diphenylvinyl)biphenyl (abbr.: DPVBi), or an anthracene derivative such as 9,10-di(2-naphthyl)anthracene (abbr.: DNA) or 9,10-bis(2-naphthyl)-2-t-butylanthracene (abbr.: t-BuDNA). Further, a polymer such as poly(9,9-dioctylfluorene) may be used. Further, as a guest material for blue light emission, a styrylamine derivative is preferable. Examples which can be given include N,N'-bis[4-(9H-carbazol-9-yl)phenyl]-N,N'-diphenylstilbene-4,4'-diamine (abbr.: YGA2S), N,N'-diphenyl-N,N'-bis(9-phenyl-9H-carbazol-3-yl)stilbene-4,4'-diamine (abbr.: PCA2S), and the like. In particular, YGA2S is preferable, because it has a peak at around 450 nm. Further, as a host material, an anthracene derivative is preferable; 9,10-bis(2-naphthyl)-2-t-butylanthracene (abbr.: t-BuDNA) and 9-[4-(10-phenyl-9-anthryl)phenyl]-9H-carbazole (abbr.: CzPA) are suitable. In particular, CzPA is preferable, because it is electrochemically stable.

Blue-green to green light emission can be obtained by, for example, using any of the following as a guest material: a coumarin dye, such as coumarin 30 or coumarin 6; bis[2-(4', 6'-difluorophenyl)pyridinato-N,C2']iridium(III) picolinate (abbr.: FIrpic); bis(2-phenylpyridinato)iridium(III) acetylacetonato ($Ir(ppy)_2(acac)$); or the like, and dispersing the guest material in a suitable host material. Further, blue-green to green light emission can be obtained by dispersing perylene or TBP, which were mentioned above, in a suitable host material at a high concentration of 5 wt % or more. Further, blue-green to green light emission can also be obtained by using a metal complex, such as BAlq, $Zn(BTZ)_2$, or bis(2-methyl-8-quinolinolato)gallium(III) chloride ($Ga(mq)_2Cl$). Further, a polymer such as poly(p-phenylenevinylene) may be used. Further, an anthracene derivative is preferable as a guest material of a blue-green to green light-emitting layer, as high light-emitting efficiency can be obtained when an anthracene derivative is used. For example, when 9,10-bis{4-[N-(4-diphenylamino)phenyl-N-phenyl]aminophenyl}-2-tert-butylanthracene (abbr.: DPABPA) is used, highly efficient blue-green light emission can be obtained. Further, an anthracene derivative in which an amino group has been substituted into the 2-position is preferable, as highly efficient green light emission can be obtained with such an anthracene derivative. In particular, N-(9,10-diphenyl-2-anthryl)-N,9-diphenyl-9H-carbazol-3-amine (abbr.: 2PCAPA) is suitable, as it has a long life. As a host material for these materials, an anthracene derivative is preferable; CzPA, which is mentioned above, is preferable, as it is electrochemically stable. Further, in the case of manufacturing a light-emitting element in which green light emission and blue light emission are combined, which has two peaks in the blue to green wavelength range (e.g., in the case of manufacturing the second light-emitting element described in Embodiment Mode 1 above), it is preferable to use an electron transporting anthracene derivative such as CzPA as a host material for a blue light-emitting layer and to use a hole transporting aromatic amine compound such as NPB as a host material for a green light-emitting layer, because when this is done, light emission can be obtained at the interface between the blue light-emitting layer and the green light-emitting layer. That is, in such a case, an aromatic amine compound like NPB is preferable as a host material of a green light-emitting material such as 2PCAPA.

Yellow to orange light emission can be obtained by, for example, using rubrene, 4-(dicyanomethylene)-2,6-bis[2-(joulolidin-9-yl)ethenyl]-4H-pyran (abbr.: BisDCJ), 4-(dicyanomethylene)-2-methyl-6-(9-julolidyl)ethynyl-4H-pyran (abbr.: DCM2), bis[2-(2-thienyl)pyridinato]acetylacetonatoiridium ($Ir(thp)_2(acac)$), bis(2-phenylquinolinato)iridium (III)acetylacetonato ($Ir(pq)_2(acac)$), or the like as a guest material, and dispersing the guest material in a suitable host material. In particular, a tetracene derivative such as rubrene is preferable as a guest material because it is highly efficient and chemically stable. As a host material in this case, an aromatic amine compound such as NPB is preferable. Alternatively, a metal complex such as bis(8-quinolinolato)zinc (abbr.: $Znq_2$), bis[2-cinnamoyl-8-quinolinolato]zinc (abbr.: $Znsq_2$), or the like can be used as a host material. Further alternatively, a polymer, such as poly(2,5-dialkoxy-1,4-phenylenevinylene) may be used.

Orange to red light emission can be obtained by, for example, using 4-(dicyanomethylene)-2,6-bis[p-(dimethylamino)styryl]-4H-pyran (abbr.: BisDCM), 4-(dicyanomethylene)-2,6-bis[2-(joulolidin-9-yl)ethenyl]-4H-pyran (abbr.: BisDCJ), 4-(dicyanomethylene)-2-methyl-6-(9-julolidyl)ethynyl-4H-pyran (abbr.: DCM2), bis[2-(2-thienyl)pyridinato]acetylacetonatoiridium ($Ir(thp)_2(acac)$), or the like as a guest material, and dispersing the guest material in a suitable host material. Orange to red light emission can also be obtained by using a metal complex such as bis(8-quinolinolato)zinc (abbr.: $Znq_2$), bis[2-cinnamoyl-8-quinolinolato]zinc (abbr.: $Znsq_2$), or the like. Further, a polymer such as poly(3-alkylthiophene) may be used. As a guest material which exhibits red light emission, a 4H-pyran derivative such as 4-(dicyanomethylene)-2,6-bis[p-(dimethylamino)styryl]-4H-pyran (abbr.: BisDCM), 4-(dicyanomethylene)-2,6-bis[2-(joulolidin-9-yl)ethenyl]-4H-pyran (abbr.: BisDCJ), 4-(dicyanomethylene)-2-methyl-6-(9-julolidyl)ethynyl-4H-pyran (abbr.: DCM2), {2-isopropyl-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbr.: DCJTI), or {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile (abbr.: BisDCJTM) is preferable because it is highly efficient. In particular, DCJTI and BisDCJTM are preferable, as they each have a light emission peak at around 620 nm. Note that for a host material, in the case of manufacturing a first light-emitting element which exhibits red light emission, as in the above-described Embodiment Mode 1, it is preferable to use a host material which includes a mixture of a metal complex such as $Alq_3$ and a tetracene derivative such as rubrene. Further, in the case of manufacturing a light-emitting element in which red light emission and blue-green light emission are combined, as in the above-described Embodiment Mode 2, preferably the host material is an aromatic amine compound such as NPB.

Note that as a suitable host material in the above structures, any material which has a light emission color with a shorter wavelength than that of the light emission color of the light-emitting organic compound, or any material whose energy gap is wider than that of the light-emitting organic compound may be used. As specific examples, a hole transporting material or electron transporting material typified by the above-mentioned examples can be selected as appropriate. Further, 4,4'-bis(N-carbazolyl)biphenyl (abbr.: CBP), 4,4',4''-tris(N-carbazolyl)triphenylamine (abbr.: TCTA), 1,3,5-tris[4-(N-carbazolyl)phenyl]benzene (abbr.: TCPB), or the like may be used.

Further, as a material for an anode of a light-emitting element of the invention (the second anodes 111 and 311, and the first anodes 121 and 321), preferably a conductive material with a high work function is used. Further, in the case where light is extracted out through the second anode 111 or 311, a transparent conductive material such as indium tin oxide (ITO), indium zinc oxide (IZO), zinc oxide (ZnO), indium tin oxide to which silicon oxide has been added, or the like may be used for the second anode 111 or 311. Further, in a case where the side which the second anode 111 or 311 is on is to have a light-shielding property, a single-layer film of titanium nitride, zirconium nitride, titanium, tungsten, nickel, Pt, chromium, or the like can be used for the second anode 111 or 311. Alternatively, a stacked film including a titanium nitride film and a film containing aluminum as a main constituent; a three-layer structure including a titanium nitride film, a film containing aluminum as a main constituent, and another titanium nitride film; or the like can be used. Further alternatively, a method in which an above-mentioned transparent conductive material is stacked over a reflective electrode formed of titanium, aluminum, or the like may be employed. Further, it is necessary for the first anodes 121 and 321 to have a light-transmitting property. Transparent conductive materials such as ITO, IZO, ZnO, and the like may be used for the first anodes 121 and 321. Alternatively, a structure in which a material which exhibits an acceptor property with respect to an above-mentioned hole transporting compound (in particular, an aromatic amine compound) is added to the hole transporting compound may be used. As specific examples, a material in which 7,7,8,8-tetracyano-2,3,5,6-tetrafluoroquinodimethane (abbr.: $F_4$-TCNQ), which is an acceptor, has been added to VOPc, or a material in which molybdenum oxide, which is an acceptor, has been added to NPB, may be used for the first anodes 121 and 321.

Further, as a material for the cathodes (the second cathodes 113 and 313, and the first cathodes 123 and 323), preferably a conductive material with a low work function is used. As specific examples, an alkali metal, such as Li or Cs; an alkaline earth metal, such as Mg, Ca, or Sr; an alloy which includes any of those (such as Mg:Ag or Al:Li); or a rare earth metal, such as Yb or Er, can be used to form the cathodes. Further, in a case where an electron injecting layer formed of LiF, CsF, $CaF_2$, $Li_2O$, or the like is employed, a common conductive thin film, such as one formed of aluminum, can be used to form the cathodes. Further, in a case where light is extracted out through the side on which the first cathode 123 or 323 is on, a stacked structure which includes an ultra-thin film containing an alkali metal such as Li or Cs and an alkaline earth metal such as Mg, Ca, or Sr, and also includes a transparent conductive film (such as a film of ITO, IZO, or ZnO) may be used. Alternatively, a structure in which a material which exhibits a donator property with respect to an above-mentioned electron transporting material (such as an alkali metal or an alkaline earth metal) is added to the electron transporting material may be used, and a transparent conductive film (such as a film of ITO, IZO, or ZnO) may be stacked over that. Further, it is necessary for the first cathodes 123 and 323 to have a light-transmitting property. A structure in which a material which exhibits a donator property with respect to an above-mentioned electron transporting material (such as an alkali metal or an alkaline earth metal) is added to the electron transporting material may be used. As specific examples, a material in which lithium, which is a donor, is added to BPhen, or a material in which lithium, which is a donor, is added to $Alq_3$, can be used.

Note that there is no limitation on a method of stacking films in a light-emitting element which is used in the manufacture of a light-emitting element of the invention described above. Any method for stacking films may be selected; for example, a vacuum evaporation method, a spin-coating method, an ink-jet method, a dip-coating method, or the like may be used.

This embodiment mode can be freely combined with Embodiment Mode 1 or Embodiment Mode 2.

The invention, which is formed using an above-described structure, will be described in further detail in the embodiments below.

Embodiment 1

A procedure for forming a light-emitting element which emits white light over a glass substrate which is based on Embodiment Mode 1 will be described below. Note that in the description, parts which correspond to those in FIG. 1A are assigned the same reference numerals as those used in FIG. 1A.

First, a glass substrate over which a film of indium tin oxide (ITO) was deposited to a thickness of 110 nm by a sputtering method or the like was prepared. In this embodiment, the deposited ITO served as the first anode 121.

Next, the glass substrate provided with the first anode 121 was fixed to a substrate holder within a vacuum evaporation system such that the surface provided with the first anode 121 faced downward. Then, a thin film including NPB, which is a hole transporting compound, and molybdenum oxide, which is a material which exhibits an acceptor property with respect to NPB, was formed by a co-evaporation method in which NPB and molybdenum oxide were each evaporation sources. At this time, adjustment was made such that molybdenum oxide was included in NPB at a concentration of 25 mass percent. The thickness of the thin film including NPB and molybdenum oxide was 50 nm. This thin film including NPB and,molybdenum oxide also served as the first anode 121.

Next, NPB was deposited over the thin film including NPB and molybdenum oxide to a thickness of 10 nm, to form a hole injecting layer. Deposition was performed by a vacuum evaporation method. Note that in this embodiment, the hole injecting layer also served as a hole transporting layer.

Subsequently, the first light-emitting layer 122 was formed over the hole injecting layer. In this embodiment, the first light-emitting layer 122 had a structure including $Alq_3$, rubrene, and DCJTI, and was formed by a co-evaporation method in which $Alq_3$, rubrene, and DCJTI were each used as evaporation sources. At this time, adjustment was made such that the mass ratio of $Alq_3$:rubrene:DCJTI in the first light-emitting layer 122 was 1:1:0.04. The thickness of the first light-emitting layer 122 was 30 nm. In this first light-emitting layer 122, the DCJTI served as a light-emitting organic compound exhibiting orange to red (in particular, red) light emission.

Next, BPhen was deposited over the first light-emitting layer 122 to a thickness of 10 nm, to form an electron transporting layer. Note that in this embodiment, the electron transporting layer also served as an electron injecting layer. Next, a thin film including BPhen and Li, which served as the first cathode 123, was formed over the electron transporting layer. This first cathode 123 included BPhen, which is an electron transporting compound, and lithium, which is a material which exhibits a donator property with respect to BPhen. The thin film including BPhen and Li was formed to a thickness of 20 nm by a co-evaporation method in which BPhen and Li were each evaporation sources. At this time, adjustment was made such that Li was included in BPhen at a concentration of 1 mass percent.

After forming the first light-emitting element 120 in this manner, the second light-emitting element 110 was stacked in series over the first light-emitting element 120. First, the second anode 111 was formed by depositing a thin film including NPB and molybdenum oxide to a thickness of 110 nm. When deposition was performed, by a co-evaporation method, adjustment was made such that molybdenum oxide was included in NPB at a concentration of 25 mass percent.

Next, NPB was deposited over the second anode 111 to a thickness of 10 nm, to form a hole injecting layer. Note that in this embodiment, the hole injecting layer also served as a hole transporting layer. Deposition was performed by a vacuum evaporation method.

Subsequently, the second light-emitting layer 112-1 and the third light-emitting layer 112-2 were formed over the hole injecting layer. The second light-emitting layer 112-1 had a structure which included NPB and 2PCAPA, and was formed by a co-evaporation method in which NPB and 2PCAPA were each evaporation sources. At this time adjustment was made such that 2PCAPA was included in NPB at a concentration of 1 mass percent. The thickness of the second light-emitting layer 112-1 was 10 nm.

Further, the third light-emitting layer 112-2 was formed by a co-evaporation method in which CzPA and YGA2S were each evaporation sources. At this time adjustment was made such that YGA2S was included in CzPA at a concentration of 4 mass percent. The thickness of the third light-emitting layer 112-2 was 20 nm.

The 2PCAPA and the YGA2S in the second light-emitting layer and the third light-emitting layer, which are in the second light-emitting element, served as light-emitting organic compounds exhibiting a different light emission color (blue to green) to that of the first light-emitting element. Note that the second light-emitting layer and the third light-emitting layer were in contact with each other.

Next, BPhen was deposited over the third light-emitting layer 112-2 to a thickness of 10 nm, to form an electron transporting layer. Note that in this embodiment, the electron transporting layer also served as an electron injecting layer. Next, a thin film including BPhen and Li, and an Al film, which served as the second cathode 313, were formed over the electron transporting layer. The thin film including BPhen and Li was formed to a thickness of 20 nm by a co-evaporation method in which BPhen and Li were each evaporation sources. At this time, adjustment was made such that Li was included in BPhen at a concentration of 1 mass percent. Further, the Al film was deposited to a thickness of 150 nm.

The second light-emitting element 110 formed in this manner exhibited light emission spectrum peaks in two places within the blue to green wavelength range. Further, since the first light-emitting element 120 exhibited red light emission, it exhibited a light emission spectrum having a peak in a different position to those of the peaks of the second light-emitting element.

Figure 3A:
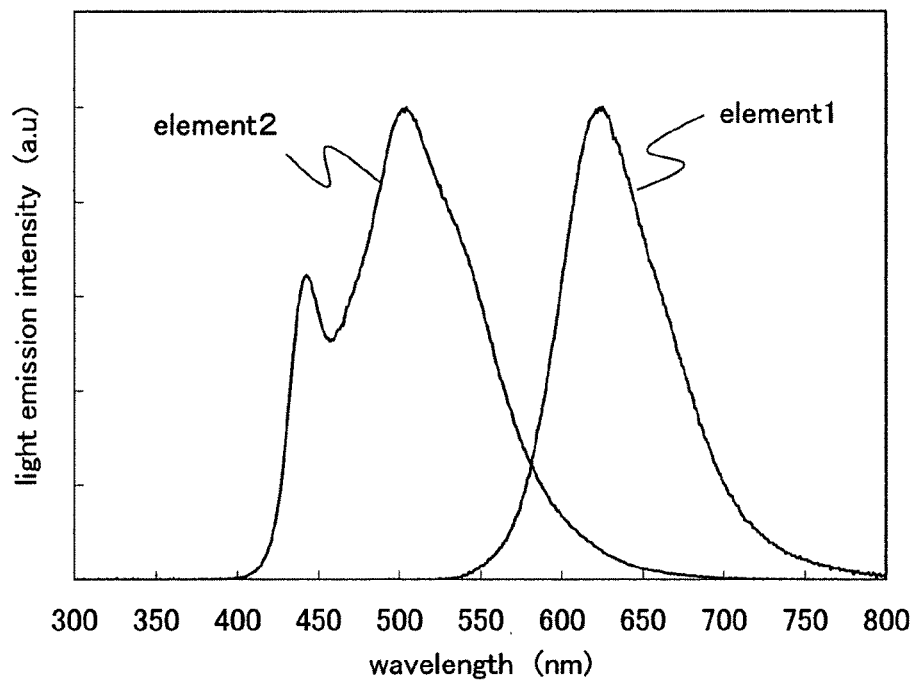
FIGS. 3A and 3B show light emission spectrums.
Figure 3B:
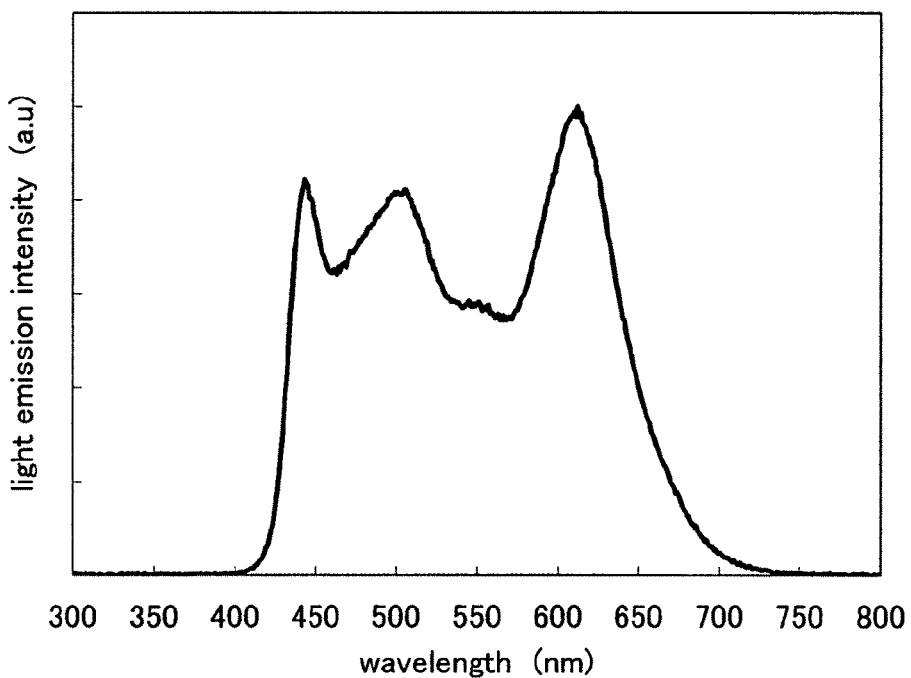

The light emission spectrum of an Element A in which the first light-emitting element and the second light-emitting element were stacked in this manner is shown in FIG. 3B. It was confirmed that Element A exhibited a broad light emission spectrum with a full-width half-maximum of 210 nm. Note that the values of the light emission spectrum shown in FIG. 3B are values obtained when a current of approximately 1 mA was applied to Element A, in which the first light-emitting element and the second light-emitting element were stacked.

Further, as a comparative example, the light-emitting spectrums of an Element 1 which was a red light-emitting element and an Element 2, which was a light-emitting element in which two light-emitting layers, a blue one and a green one, were stacked, are each shown in FIG. 3A. Note that Element 1 had the same structure as the first light-emitting element 120 described above, and Element 2 had the same structure as the second light-emitting element 110 described above. The light emission spectrum of Element A, which is shown in FIG. 3B, is different from a spectrum in which the spectrums of Element 1 and Element 2 in FIG. 3A are simply combined.

When light emitted passes through stacked films, there is the risk that the light emitted will undergo multiple interference due to difference in refractive indices and film thicknesses of each layer. As a result of this, a light emission spectrum varies depending on the angle at which a surface through which light emitted is extracted out is viewed, and a light-emitting device has viewing angle dependency, and therefore the white color varies. Element A is a light-emitting element whose element structure is designed to overcome this.

Figure 4:
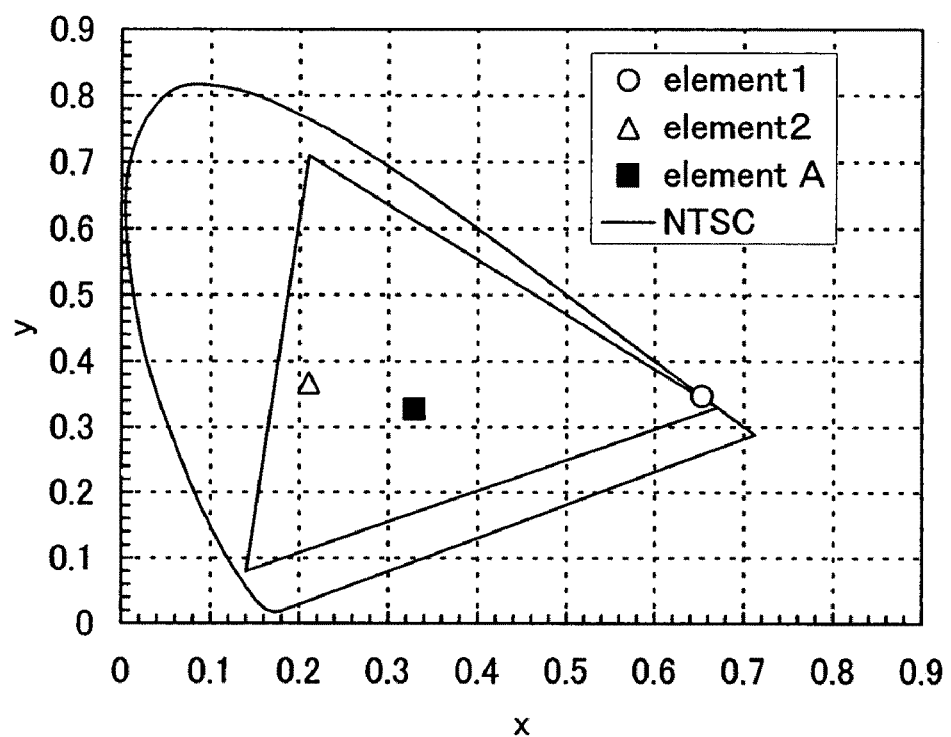
FIG. 4 is a graph showing CIE chromaticity coordinates.

FIG. 4 shows CIE chromaticity coordinates for when a current of approximately 1 mA was applied to Element A, in which the first light-emitting element and the second light-emitting element were stacked. Element A exhibited good white color, having CIE chromaticity coordinates of (x, y)= (0.33, 0.33). Note that the CIE chromaticity coordinates of the white color according to NTSC standards are (x, y)=(0.31, 0.33). Further, the CIE chromaticity coordinates of Element 1 and Element 2, which are comparative examples, are also shown in FIG. 4. The light emission of Element A can be said to be a synthesis of the light emission of Element 1 and Element 2, because the CIE chromaticity coordinates of Element A are approximately located on a straight line joining the CIE chromaticity coordinates of Element 1 and Element 2.

The light emitted from the light-emitting element described in this embodiment is suitable for lighting devices. Naturally, it is also suitable for a backlight of a liquid crystal display, and the like.

This embodiment can be freely combined with Embodiment Mode 1.

Embodiment 2

A procedure for forming a light-emitting element which emits white light over a glass substrate which is based on Embodiment Mode 2 will now be described. Note that in the description, parts which correspond to those in FIG. 2A are assigned the same reference numerals as those used in FIG. 1A.

First, a glass substrate over which a film of indium tin oxide (ITO) was deposited to a thickness of 110 nm by a sputtering method or the like was prepared. In this embodiment, the deposited ITO serves as the first anode 321.

Next, the glass substrate provided with the first anode 321 was fixed to a substrate holder within a vacuum evaporation system such that the surface provided with the first anode 321 faced downward. Then, a thin film including NPB, which is a hole transporting compound, and molybdenum oxide, which is a material which exhibits an acceptor property with respect to NPB, was formed by a co-evaporation method in which NPB and molybdenum oxide were each used as evaporation sources. At this time, adjustment was made such that molybdenum oxide was included in NPB at a concentration of 25 mass percent. The thickness of the thin film including NPB and molybdenum oxide was 50 nm. This thin film including NPB and molybdenum oxide also served as the first anode 321.

Next, NPB was deposited over the thin film including NPB and molybdenum oxide. to a thickness of 10 nm to form a hole injecting layer. Deposition was performed by a vacuum evaporation method. Note that in this embodiment, the hole injecting layer also served as a hole transporting layer.

Subsequently, the first light-emitting layer 322-1 and the second light-emitting layer 322-2 were formed over the hole injecting layer. In this embodiment, the first light-emitting layer 322-1 had a structure including NPB and BisDCJTM, and was formed by a co-evaporation method in which NPB and BisDCJTM were each used as evaporation sources. At this time, adjustment was made such that BisDCJTM was included in NPB at a concentration of 0.5 mass percent. The thickness of the first light-emitting layer 322-1 was 10 nm.

Further, the second light-emitting layer 322-2 was formed by a co-evaporation method in which CzPA and DPABPA were each used as evaporation sources. At this time, adjustment was made such that DPABPA was included in CzPA at a concentration of 10 mass percent. The thickness of the second light-emitting layer 322-2 was 20 nm.

In the first light-emitting layer and the second light-emitting layer of the first light-emitting element 320, BisDCJTM and DPABPA each emitted light. The light emitted from the BisDCJTM and DPABPA was synthesized and exhibited a white color. Note that the first light-emitting layer and the second light-emitting layer were in contact with each other.

Next, BPhen was deposited over the second light-emitting layer 322-2 to a thickness of 10 nm to form an electron transporting layer. Note that in this embodiment, the electron transporting layer also served as an electron injecting layer. Next, a thin film including BPhen and Li which served as the first cathode 323 was formed over the electron transporting layer. This first cathode 323 included BPhen, which is an electron transporting compound, and lithium, which is a material which exhibits a donator property with respect to BPhen. The thin film including BPhen and Li was formed to a thickness of 20 nm by a co-evaporation method in which BPhen and Li were each evaporation sources. At this time, adjustment was made such that Li was included in BPhen at a concentration of 1 mass percent.

After forming the first light-emitting element 320 in this manner, the second light-emitting element 310 was stacked in series over the first light-emitting element 320. First, the second anode 311 was formed by depositing a thin film including NPB and molybdenum oxide to a thickness of 110 nm. When deposition was performed, by a co-evaporation method, adjustment was made such that molybdenum oxide was included in NPB at a concentration of 25 mass percent.

Next, NPB was deposited over the second anode 311 to a thickness of 10 nm, to form a hole injecting layer. Note that in this embodiment, the hole injecting layer also served as a hole transporting layer. Deposition was performed by a vacuum evaporation method.

Subsequently, the third light-emitting layer 312-1 and the fourth light-emitting layer 312-2 were formed over the hole injecting layer. The third light-emitting layer 312-1 had a structure which included NPB and rubrene, and was formed by a co-evaporation method in which NPB and rubrene were each evaporation sources. At this time adjustment was made such that rubrene was included in NPB at a concentration of 1.5 mass percent. The thickness of the third light-emitting layer 312-1 was 10 nm. In the third light-emitting layer, rubrene served as a light-emitting organic compound which exhibited a yellow color.

Further, the fourth light-emitting layer 312-2 was formed by a co-evaporation method in which CzPA and YGA2S were each evaporation sources. At this time adjustment was made such that YGA2S was included in CzPA at a concentration of 4 mass percent. The thickness of the fourth light-emitting layer 312-2 was 20 nm. In the fourth light-emitting layer, YGA2S served as a light-emitting organic compound which exhibited a blue color.

Next, BPhen was deposited over the fourth light-emitting layer 312-2 to a thickness of 10 nm to form an electron transporting layer. Note that in this embodiment, the electron transporting layer also served as an electron injecting layer. Next, a thin film including BPhen and Li, and an Al film, which function as the second cathode 313, were formed over the electron transporting layer. The thin film including BPhen and Li was formed to a thickness of 20 nm by a co-evaporation method in which BPhen and Li were each evaporation sources. At this time, adjustment was made such that Li was included in BPhen at a concentration of 1 mass percent. Further, the Al film was deposited to a thickness of 150 nm.

In the third light-emitting layer and the fourth light-emitting layer of the second light-emitting element 310, rubrene and YGA2S each emitted light. The light emitted from the rubrene and the YGA2S was synthesized and exhibited a white color. Note that the third light-emitting layer and the fourth light-emitting layer were in contact with each other.

Note that the spectrum of the white light emission obtained with the second light-emitting element 310 and the spectrum of the white light emission obtained with the first light-emitting element 320 are different to each other. Accordingly, by synthesizing the white light emission obtained with the second light-emitting element 310 and the white light emission obtained with the first light-emitting element 320, broad white light emission which widely covers a wavelength range can be obtained.

Figure 5A:
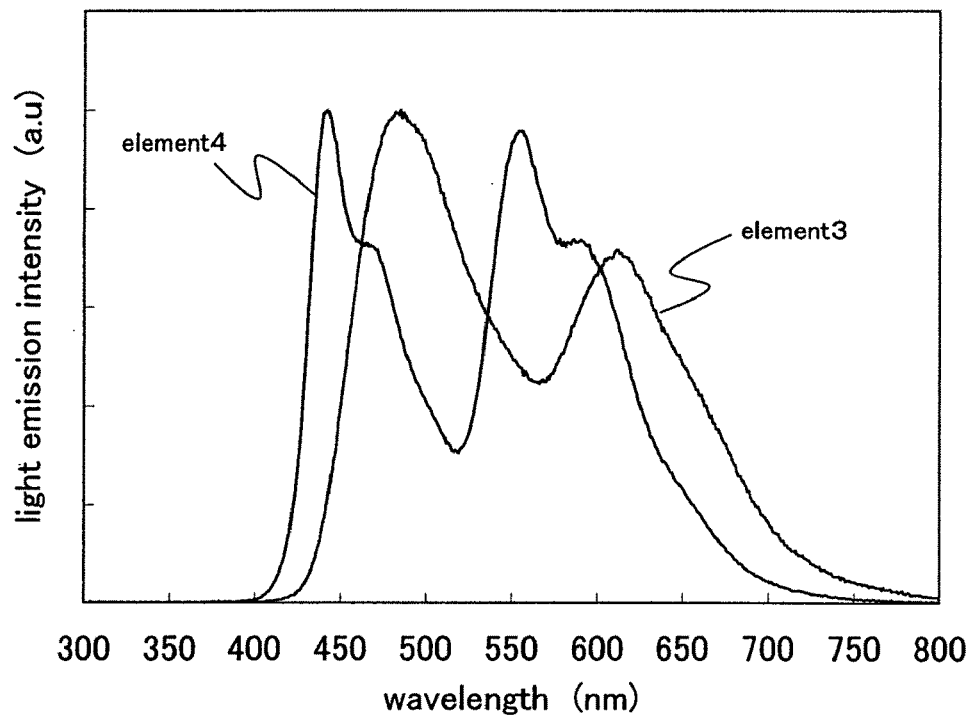
FIGS. 5A and 5B show light emission spectrums.
Figure 5B:
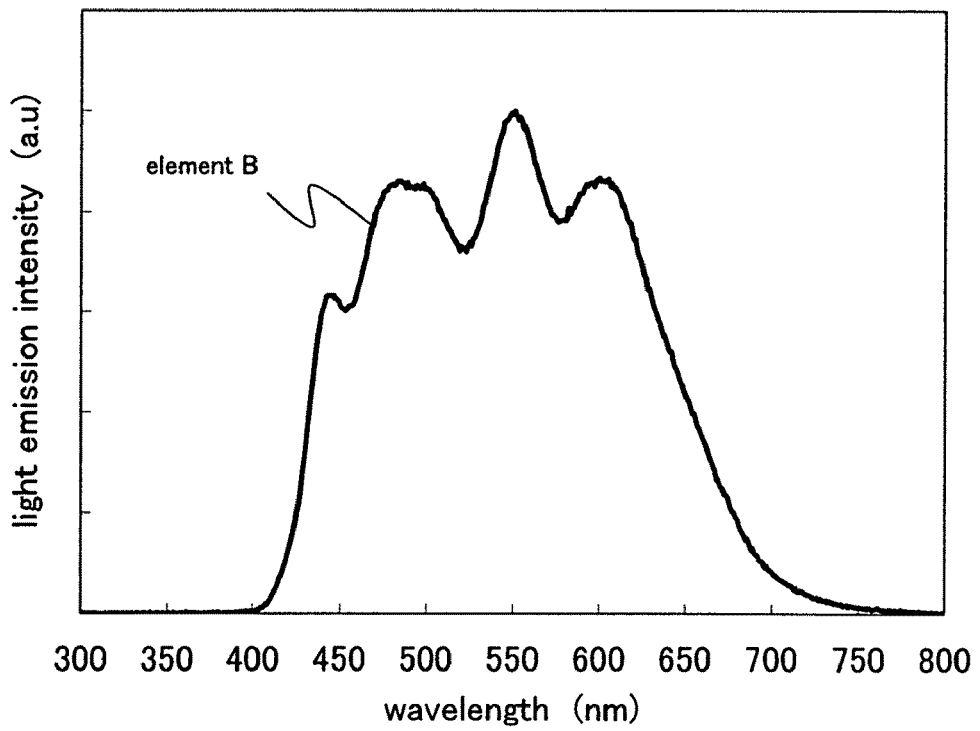

The light emission spectrum of an Element B in which the first light-emitting element and the second light-emitting element are stacked in this manner is shown in FIG. 5B. It was confirmed that Element B had a broad light emission spectrum with a full-width half-maximum of 210 nm. Further, with Element B, a trapezoidal light emission spectrum for which the intervals between its plurality of peaks was narrow and which covered a broad range of the visible light range was obtained. Note that the values of the light emission spectrum shown in FIG. 5B are values obtained when a current of approximately 1 mA was applied to Element B in which the first light-emitting element and the second light-emitting element were stacked. Further, Element B exhibited a good white color, having CIE chromaticity coordinates of (x, y)= (0.32, 0.37).

Further, as a comparative example, the light-emitting spectrums of an Element 3 which was a red and blue-green light-emitting element and an Element 4, which was a light-emitting element in which two light-emitting layers, a blue one and a yellow one, are stacked, are each shown in FIG. 5A. Note that Element 3 had the same structure as the first light-emitting element 320 described above, and Element 4 had the same structure as the second light-emitting element 310 described above. The light emission spectrum of Element B shown in FIG. 5B differs from a spectrum in which the spectrums of Element 3 and Element 4 in FIG. 5A are simply combined. Further, it can be seen from the spectrums of Element 3 and Element 4 in FIG. 5A that the spectrums of the white light emission obtained with the second light-emitting element 310 and the white light emission obtained with the first light-emitting element 320 are different to each other.

When light emitted passes through stacked films, there is the risk that the light emitted will undergo multiple interference due to difference in refractive indices and film thicknesses of each layer. As a result of this, a light emission spectrum varies depending on the angle at which a surface through which light emitted is extracted out is viewed, and a light-emitting device has viewing angle dependency, and therefore the white color varies. Element B is a light-emitting element whose element structure is designed to overcome this.

Figure 6:
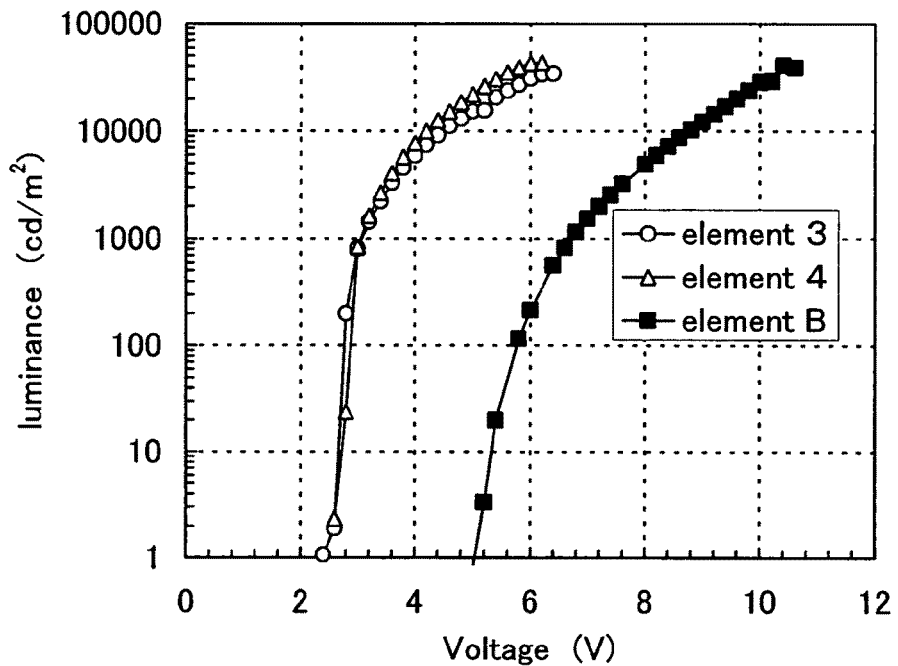
FIG. 6 is a graph showing voltage-luminance characteristics.

Further, FIG. 6 is a graph showing voltage-luminance characteristics for each of Element B, Element 3, and Element 4, in which the vertical axis represents luminance and the horizontal axis represents voltage. From this graph which shows the voltage-luminance characteristics it can be seen that the driving voltage of Element B is roughly the sum of the driving voltages of Element 3 and Element 4. Further, from the luminance-current efficiency characteristics shown in FIG. 7, it can be seen that the current efficiency of Element B is roughly the sum of the current efficiencies of Element 3 and Element 4.

Figure 7:
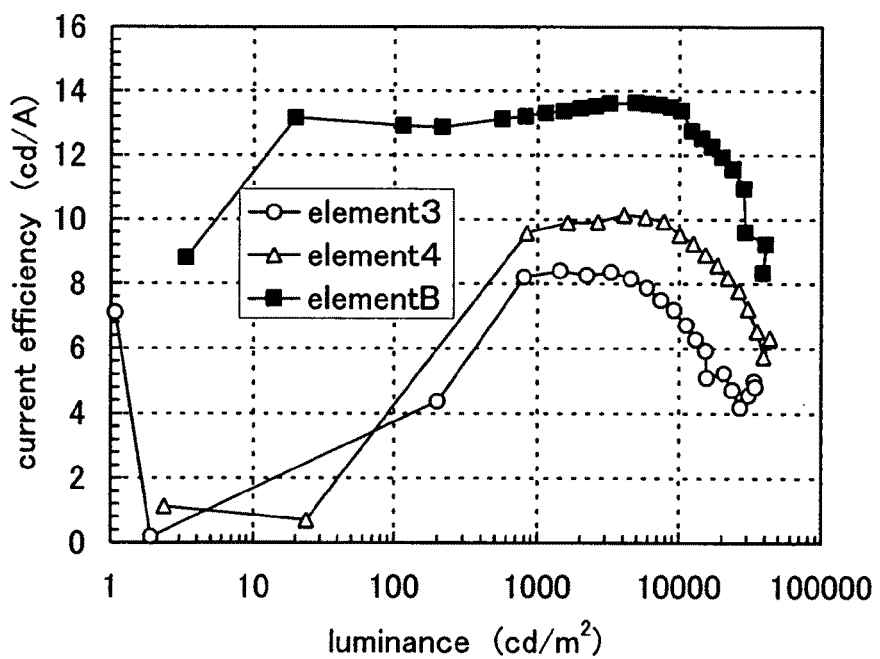
FIG. 7 is a graph showing luminance-current efficiency characteristics.

FIG. 7 is a graph showing luminance-current efficiency characteristics for each of Element B, Element 3, and Element 4, in which the vertical axis represents current efficiency and the horizontal axis represents luminance. Thus, multi-wavelength light emission from the light-emitting element of this embodiment, in which just two light-emitting elements were layered, was observed. Therefore, the light-emitting element of this embodiment can be driven at a very low voltage. For example, a luminance of 5000 cd/m$^2$ or more was obtained at an applied voltage of 8 V. Further, relatively high power efficiency was obtained (6.11 m/W).

The light emission which can be emitted from the light-emitting element described in this embodiment has superior color rendering properties and is suitable for lighting devices. Naturally, it is also suitable for a backlight of a liquid crystal display, and the like.

This embodiment can be freely combined with Embodiment Mode 2.

Embodiment 3

Figure 8A:
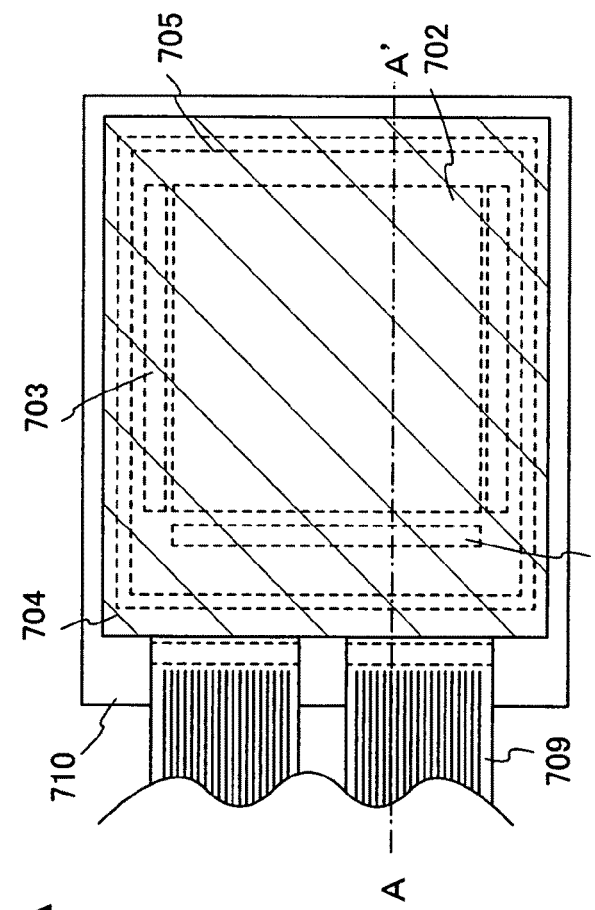
FIGS. 8A and 8B show a structure of a light-emitting device which employs a light-emitting element of the invention.
Figure 8B:
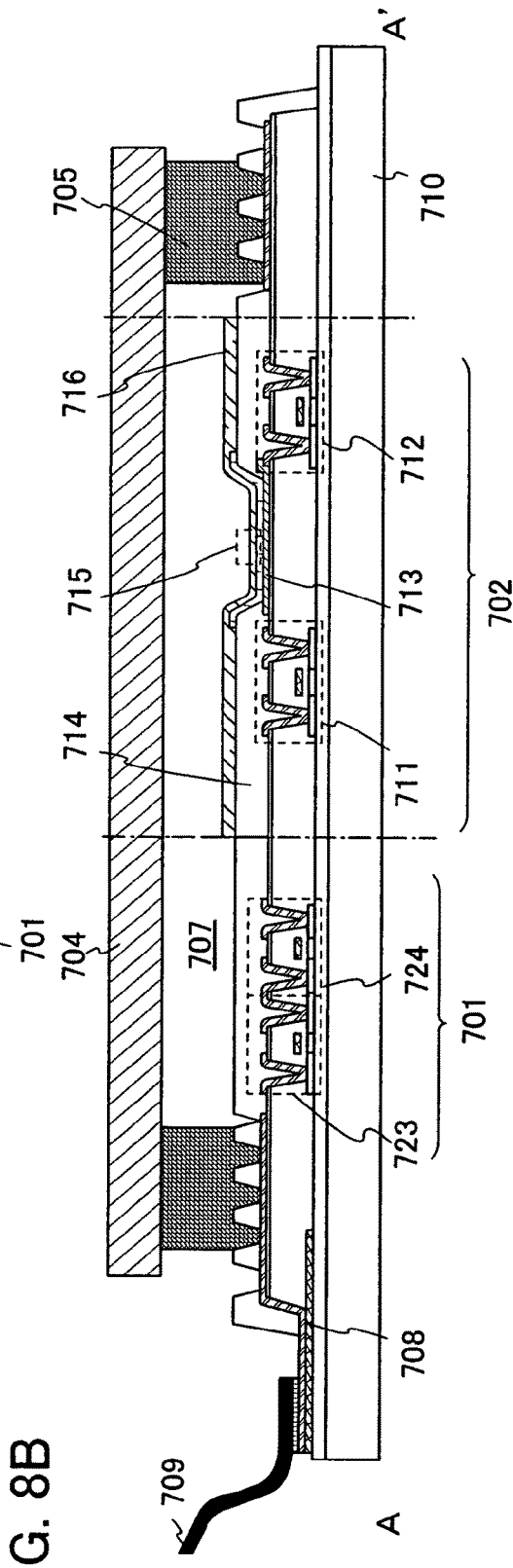

In this embodiment, a light-emitting device having a light-emitting element of the invention will be described with reference to FIGS. 8A and 8B. Note that FIG. 8A is a top view of a light-emitting device and FIG. 8B is a cross section taken along the line A-A' in FIG. 8A. A portion 701, indicated by a dotted line, is a driver circuit portion (a source side driver circuit); a portion 702, indicated by a dotted line, is a pixel portion; and a portion 703, indicated by a dotted line, is a driver circuit portion (a gate side driver circuit). Further, reference numeral 704 indicates a sealing substrate and reference numeral 705 indicates sealant. Reference numeral 707 indicates a space which is an inside portion surrounded by the sealant 705.

Further, 708 is a wiring for transmitting signals which are input to the source side driver circuit 701 and the gate side driver circuit 703, and receives video signals, clock signals, start signals, reset signals, and the like from an FPC (flexible printed circuit) 709 which serves as an external input terminal. Note that a printed wiring board (PWB) may be attached to the FPC, although only the FPC is illustrated here. In this specification, 'light-emitting device' refers not only to the body of a light-emitting device, but also to a light-emitting device fitted with an FPC or a PWB.

Next, a cross-sectional structure will be described with reference to FIG. 8B. Over an element substrate 710, driver circuit portions and a pixel portion are formed. Here, the source side driver circuit 701, which is a driver circuit portion, and the pixel portion 702 are shown.

Note that a CMOS circuit in which an n-channel TFT 723 and a p-channel TFT 724 are combined is formed as the source side driver circuit 701. A circuit included in the driver circuit may be a known CMOS circuit, PMOS circuit, or NMOS circuit. Furthermore, in this embodiment, a driver-integrated-type structure in which the driver circuit is formed over the substrate is described; however, the driver circuit does not necessarily have to be formed over the substrate. The driver circuit can be formed external to the substrate instead of over the substrate.

Further, the pixel portion 702 includes a plurality of pixels, which include a switching TFT 711, a current controlling TFT 712, and an anode 713 which is electrically connected to a drain of the current controlling TFT 712. Note that an insulator 714 is formed such that it covers an end portion of the anode 713. Here, the insulator 714 is formed using a positive photosensitive acrylic resin film.

Further, to obtain good coverage by the film, either an upper end portion or a lower end portion of the insulator 714 is formed such that it has a curved surface having a curvature. For example, in the case of using a positive photosensitive acrylic as a material for the insulator 714, it is preferable to give only an upper end portion of the insulator 714 a curved surface, having a curvature radius (of 0.2 to 3 µm). Further, as the insulator 714, either a photosensitive negative material, which becomes insoluble in etchant when irradiated with light, or a photosensitive positive material, which becomes soluble in etchant when irradiated with light, can be used. The material is not limited to an organic compound. An inorganic compound, for example, silicon oxide, silicon oxynitride, or the like can be used.

A light-emitting element 715 and a cathode 716 of the invention are each formed over the anode 713. A material with a high work function is preferably used as a material for the anode 713. For example, a single layer film, such as an ITO (indium tin oxide) film, an ITSO (indium tin silicon oxide) film, an indium zinc oxide (IZO) film, a titanium nitride film, a chromium film, a tungsten film, a Zn film, a Pt film, or the like, can be used. Alternatively, a stacked-layer structure including titanium nitride and a film containing aluminum as a main constituent; a three-layer structure including a titanium nitride film, a film containing aluminum as a main constituent, and another titanium nitride film, or the like can be used. Further, when an ITO film is used for the anode 713, and a stacked-layer structure including titanium nitride and a film containing aluminum as a main constituent, or a stacked-layer structure including a titanium nitride film, a film containing aluminum as a main constituent, and another titanium nitride film is used for a wiring of the current controlling TFT 712 which is connected with the anode 713, the resistance of the wiring is low, good ohmic contact can be obtained with the ITO film, and furthermore, the anode 713 can be made to function as an anode. Further, the anode 713 may be formed of the same material as a first anode of the light-emitting element 715 of the invention. Alternatively, the anode 713 may be stacked such that it is in contact with the first anode of the light-emitting element 715.

Further, the light-emitting element 715 of the invention has a structure such as that shown in FIG. 1A in which the second light-emitting element 110 and the first light-emitting element 120 are stacked, or a structure such as that shown in FIG. 2A in which the second light-emitting element 310 and the first light-emitting element 320 are stacked. Specifically, the light-emitting element 715 has a structure such as that described in Embodiment Mode 1 or Embodiment Mode 2.

Further, as a material for the cathode 716, a material with a low work function (e.g., Al, Ag, Li, or Ca; alloys of those, such as MgAg, MgIn, AlLi, or $CaF_2$; or calcium nitride) may be used; however, the material is not limited to these materials, and when a suitable electron injecting material is selected, various conductive films can be applied. Note that in the case where light emitted from the light-emitting element 715 of the invention is to be transmitted through the cathode 716, a method in which a stacked-layer structure, which includes a metal thin film with a small thickness and a transparent conductive film (which includes ITO (indium tin oxide), ITSO (indium tin silicon oxide), indium zinc oxide ($In_2O_3$—ZnO), zinc oxide (ZnO), or the like), is used may be employed as the cathode 716. Further, the cathode 716 may be formed of the same material as a second cathode of the light-emitting element 715 of the invention. Alternatively, the cathode 716 may be stacked such that it is in contact with the second cathode of the light-emitting element 715.

Furthermore, when the sealing substrate 704 is attached to the element substrate 710 using the sealant 705, a structure is obtained in which the light-emitting element 715 is provided in the space 707 which is enclosed by the element substrate 710, the sealing substrate 704, and the sealant 705. Note that the space 707 may be filled with an inert gas (e.g., nitrogen or argon), or with the sealant 705, for example.

Note that preferably an epoxy-based resin is used as the sealant 705. Further, it is desirable that a material for the sealant 705 is a material which allows as little moisture and oxygen as possible to penetrate through. Further, as the sealing substrate 704, a glass substrate, a quartz substrate, or a plastic substrate formed of FRP (fiberglass-reinforced plastic), PVF (polyvinyl fluoride), polyester, acrylic, or the like can be used.

A light-emitting device having a light-emitting element of the invention can be obtained in the above manner.

Note that structures of the light-emitting elements described in Embodiment Mode 1 and Embodiment Mode 2 can be freely combined with the light-emitting device described in this embodiment. Further, if necessary, a chromaticity conversion film such as a color filter may be employed for the light-emitting device described in this embodiment.

Embodiment 4

In this embodiment, various electrical appliances which have been manufactured using a light-emitting device which includes a light-emitting element of the invention will be described with reference to FIGS. 9A to 9E.

Examples of electrical appliances manufactured using a light-emitting device which includes a light-emitting element of the invention include televisions, video cameras, digital cameras, goggle-type displays (head-mounted displays), navigation systems, sound reproduction devices (e.g., car audio systems or audio components), notebook personal computers, game machines, portable information terminals (e.g., mobile computers, portable telephones, portable game machines, and electronic books), image reproduction devices equipped with a recording medium (specifically, devices which play back a recording medium such as a digital versatile disc (DVD) and which have a display device which can display the images), lighting appliances, and the like. Specific examples of such electrical appliances are shown in FIGS. 9A to 9E.

Figure 9A:
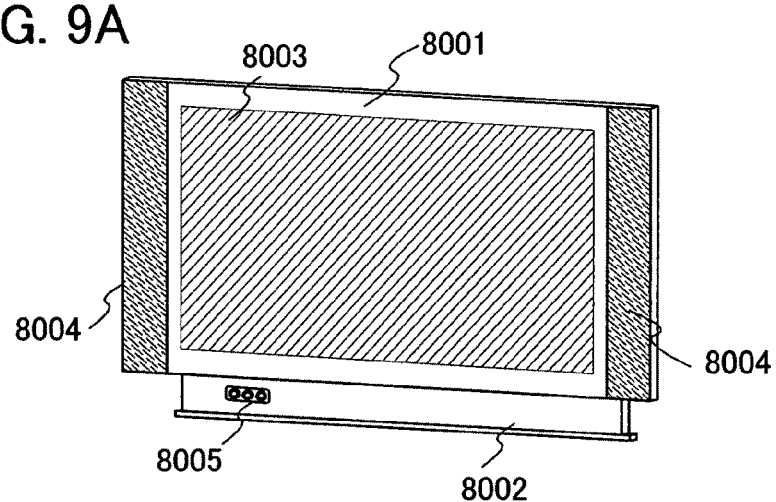
FIGS. 9A to 9E show examples of electrical appliances which employ a light-emitting device of the invention.

FIG. 9A is a display device which includes a housing 8001, a support 8002, a display portion 8003, speaker portions 8004, video input terminals 8005, and the like. The display device is manufactured using a display device which includes the invention as the display portion 8003. Note that the term 'display device' refers to any kind of information display device, such as an information display device for a personal computer, for receiving a TV broadcast, or for displaying advertisements.

Figure 9B:
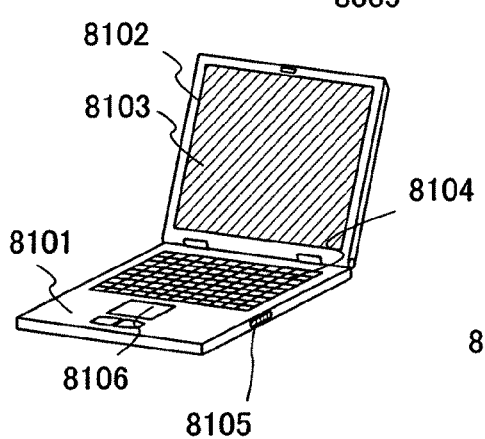

FIG. 9B is a notebook personal computer which includes a main body 8101, a housing 8102, a display portion 8103, a keyboard 8104, an external connection port 8105, a pointing device 8106, and the like. The notebook personal computer is manufactured using a display device which includes a light-emitting element of the invention as the display portion 8103.

Figure 9C:
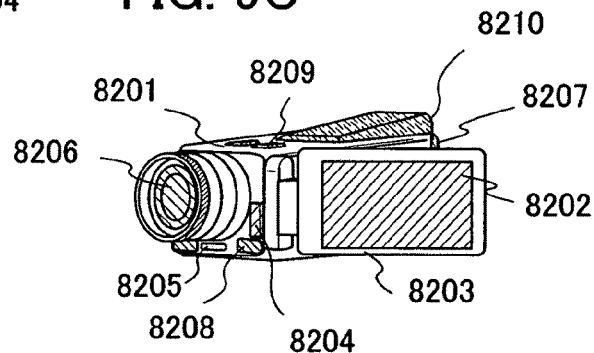

FIG. 9C is a video camera which includes a main body 8201, a display portion 8202, a housing 8203, an external connection port 8204, a remote control receiver portion 8205, an image receiving portion 8206, a battery 8207, an audio input portion 8208, operation keys 8209, an eyepiece portion 8210, and the like. The video camera is manufactured using a display device which includes a light-emitting element of the invention as the display portion 8202.

Figure 9D:

FIG. 9D is a desk lighting appliance which includes a lighting portion 8301, a shade 8302, an adjustable arm 8303, a support rod 8304, a stand 8305, and a power supply portion 8306. The desk lighting appliance is manufactured using a display device which includes a light-emitting element of the invention as the lighting portion 8301. Note that the term 'lighting appliance' also encompasses ceiling lights, wall lights, and the like.

Figure 9E:
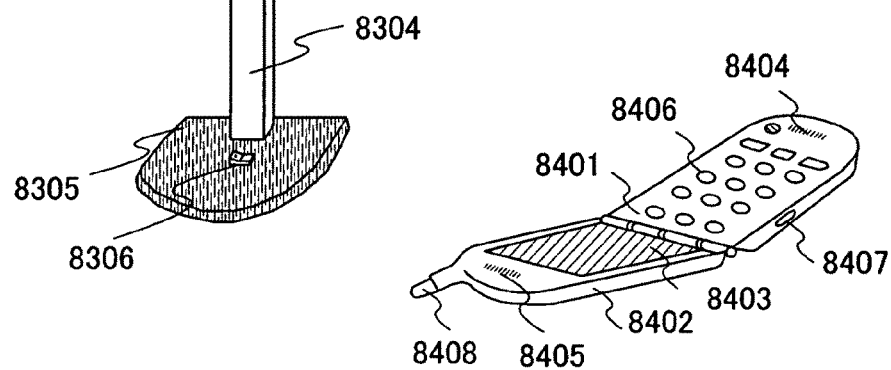

FIG. 9E is a portable telephone which includes a main body 8401, a housing 8402, a display portion 8403, an audio input portion 8404, an audio output portion 8405, operation keys 8406, an external connection port 8407, an antenna 8408, and the like. The portable telephone is manufactured using a display device which includes a light-emitting element of the invention as the display portion 8403.

An electrical appliance or a lighting appliance which employs a light-emitting element of the invention can be obtained in the above manner. The range of application of a light-emitting device including a light-emitting element of the invention is very wide. Such a light-emitting device can be applied to electrical appliances in all kinds of fields.

The present application is based on Japanese Patent Application Serial No. 2006-324226 filed on 30 Nov. 2006 with the Japanese Patent Office, the entire contents of which are hereby incorporated by reference.

What is claimed is:

1. A light-emitting element which exhibits white light emission, comprising:
   a substrate having a light-transmitting property,
   a first light-emitting element; and
   a second light-emitting element,
   wherein the first light-emitting element and the second light-emitting element are stacked in series over the substrate having a light-transmitting property;
   wherein the first light-emitting element comprises a first anode, a first cathode, and a first light-emitting layer including a light-emitting organic compound, which is interposed between the first anode and the first cathode;
   wherein the second light-emitting element comprises a second anode, a second cathode, and a second light-emitting layer and a third light-emitting layer which each include a light-emitting organic compound, which are interposed between the second anode and the second cathode;
   wherein the first cathode is in contact with the second anode;
   wherein the first light-emitting element exhibits a first light emission spectrum having a peak in a red wavelength range, and the second light-emitting element exhibits a second light emission spectrum having a peak in a blue wavelength range and a peak in a green wavelength range, and
   wherein the second light-emitting layer comprises:
   a host material comprising an electron transporting anthracene derivative.

2. The light-emitting element according to claim 1, wherein the first light-emitting layer comprises:
   a guest material comprising a 4H-pyran derivative; and
   a host material comprising a mixture of a metal complex and a tetracene derivative.

3. The light-emitting element according to claim 1, wherein the second light-emitting layer comprises:
   a guest material comprising an anthracene derivative in which an amino group is substituted into a 2-position.

4. The light-emitting element according to claim 1, wherein the third light-emitting layer comprises:
   a guest material comprising a styryl amine derivative; and
   a host material comprising an electron transporting anthracene derivative.

5. The light-emitting element according to claim 1, wherein the first light-emitting layer comprises:
   a guest material comprising {2-isopropyl-6-[2-(2,3,6,7-tetrahydro-1,1,7,7-tetramethyl-1H,5H-benzo[ij]quinolizin-9-yl)ethenyl]-4H-pyran-4-ylidene}propanedinitrile or {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile; and
   a host material comprising a mixture of tris(8-quinolinolato)aluminum and rubrene.

6. The light-emitting element according to claim 1, wherein the second light-emitting layer comprises:
   a guest material comprising N-(9,10-diphenyl-2-anthryl)-N,9-diphenyl-9H-carbazol-3-amine; and
   a host material comprising 4,4'-bis[N-(1-naphthyl)-N-phenylamino]biphenyl.

7. The light-emitting element according to claim 1, wherein the third light-emitting layer comprises:
   a guest material comprising N,N'-bis[4-(9H-carbazol-9-yl)phenyl]-N,N'-diphenylstilbene-4,4'-diamine; and
   a host material comprising 9-[4-(10-phenyl-9-anthryl)phenyl]-9H-carbazole.

8. A light-emitting device comprising the light-emitting element according to claim 1, wherein the third light-emitting layer comprises:
   a host material comprising an electron transporting anthracene derivative.

9. A light-emitting element comprising:
a first light-emitting element; and
a second light-emitting element,
wherein the first light-emitting element and the second light-emitting element are stacked in series;
wherein the first light-emitting element comprises a first anode, a first cathode, and a first light-emitting layer and a second light-emitting layer which each include a light-emitting organic compound, which are interposed between the first anode and the first cathode;
wherein the second light-emitting element comprises a second anode, a second cathode, and a third light-emitting layer and a fourth light-emitting layer which each include a light-emitting organic compound, which are interposed between the second anode and the second cathode;
wherein the first light-emitting element exhibits a first light emission spectrum, and the second light-emitting element exhibits a second light emission spectrum which is different to the first light emission spectrum;
wherein the first light emission spectrum of the first light-emitting element and the second light emission spectrum of the second light-emitting element are synthesized to form white light emission, and
wherein the second light-emitting layer comprises:
a host material comprising an electron transporting anthracene derivative.

10. The light-emitting element according to claim 9, wherein the first light-emitting layer comprises:
a guest material comprising a 4H-pyran derivative; and
a host material comprising an aromatic amine compound.

11. The light-emitting element according to claim 9, wherein the second light-emitting layer comprises:
a guest material comprising an anthracene derivative.

12. The light-emitting element according to claim 9, wherein the third light-emitting layer comprises:
a guest material comprising a tetracene derivative; and
a host material comprising an aromatic amine compound.

13. The light-emitting element according to claim 9, wherein the fourth light-emitting layer comprises:
a guest material comprising a styryl amine derivative; and
a host material comprising an anthracene derivative.

14. The light-emitting element according to claim 9, wherein the first light-emitting layer comprises:
a guest material comprising {2,6-bis[2-(2,3,6,7-tetrahydro-8-methoxy-1,1,7,7-tetramethyl-1H,5H-benzo[ij]quinolizin-9-yl)ethenyl]-4H-pyran-4-ylidene}propanedinitrile; and
a host material comprising 4,4'-bis[N-(1-naphthyl)-N-phenylamino]biphenyl.

15. The light-emitting element according to claim 9, wherein the second light-emitting layer comprises:
a guest material comprising 9,10-bis{4-[N-(4-diphenylamino)phenyl-N-phenyl]aminophenyl}-2-tert-butylanthracene; and
a host material comprising 9-[4-(10-phenyl-9-anthryl)phenyl]-9H-carbazole.

16. The light-emitting element according to claim 9, wherein the third light-emitting layer comprises:
a guest material comprising rubrene; and
a host material comprising 4,4'-bis[N-(1-naphthyl)-N-phenylamino]biphenyl.

17. The light-emitting element according to claim 9, wherein the fourth light-emitting layer comprises:
a guest material comprising N,N'-bis[4-(9H-carbazol-9-yl)phenyl]-N,N'diphenylstilbene-4,4'-diamine; and
a host material comprising 9-[4-(10-phenyl-9-anthryl)phenyl]-9H-carbazole.

18. The light-emitting element according to claim 9, wherein the light-emitting element exhibits white light emission having a light emission spectrum with a trapezoidal shape.

19. A light-emitting device comprising the light-emitting element according to claim 9, further comprising a color filter.

20. A light-emitting device comprising the light-emitting element according to claim 9, wherein the third light-emitting layer comprises:
a host material comprising an electron transporting anthracene derivative.

* * * * *